US 10,725,123 B2

(12) United States Patent
Shalev

(10) Patent No.: US 10,725,123 B2
(45) Date of Patent: Jul. 28, 2020

(54) GRADIOMETER SYSTEM AND METHOD

(71) Applicant: ISRAEL AEROSPACE INDUSTRIES LTD., Lod (IL)

(72) Inventor: Gil Shalev, Omer (IL)

(73) Assignee: ISRAEL AEROSPACE INDUSTRIES LTD., Lod (IL)

(*) Notice: Subject to any disclaimer, the term of this patent is extended or adjusted under 35 U.S.C. 154(b) by 363 days.

(21) Appl. No.: 15/746,507

(22) PCT Filed: Jul. 21, 2016

(86) PCT No.: PCT/IL2016/050796
§ 371 (c)(1),
(2) Date: Jan. 22, 2018

(87) PCT Pub. No.: WO2017/013657
PCT Pub. Date: Jan. 26, 2017

(65) Prior Publication Data
US 2018/0210039 A1    Jul. 26, 2018

(30) Foreign Application Priority Data

Jul. 21, 2015   (IL) .......................................... 240057
May 26, 2016  (IL) .......................................... 245893

(51) Int. Cl.
*G01R 33/022*    (2006.01)
*G01R 33/032*    (2006.01)
(Continued)

(52) U.S. Cl.
CPC ......... *G01R 33/022* (2013.01); *G01R 33/032* (2013.01); *G01V 3/081* (2013.01); *G01V 3/165* (2013.01); *G01V 3/38* (2013.01)

(58) Field of Classification Search
CPC .... G01R 33/022; G01R 33/032; G01V 3/081; G01V 3/165; G01V 3/38
See application file for complete search history.

(56) References Cited

U.S. PATENT DOCUMENTS 3,860,311 A   1/1975 Shernoff et al.
4,489,274 A   12/1984 Berlincourt
(Continued)

FOREIGN PATENT DOCUMENTS

WO   2012/020716 A1   2/2012
WO   2012038948 A2    3/2012

OTHER PUBLICATIONS

Guttin, et al., An isotropic earth field scalar magnetometer using optically pumped helium 4, Journal De Physique IV, 1994, pp. C4-655-C4659, vol. 4.
(Continued)

*Primary Examiner* — Son T Le
*Assistant Examiner* — Adam S Clarke
(74) *Attorney, Agent, or Firm* — Browdy and Neimark, PLLC

(57) ABSTRACT

A gradiometer system including one or more magnetic sensor(s) is disclosed. The gradiometer includes an actuation module connectable to the magnetic sensor(s) to vary one or more sensing positions at which a magnetic field is sensed thereby. The one or more sensing positions are varied according to a certain displacement function indicating a predetermined displacement between the sensing positions as a function of time. A controller of the gradiometer system is adapted to determine at least one vector component of a gradient of the magnetic field sensed by the sensor(s) by carrying out the following: (i) obtaining readout data from the sensor(s) indicative of the magnetic field sensed at the varied sensing positions during a certain measurement time duration; (ii) processing the readout data to determine a differential magnetic field time profile indicating a difference between the magnetic fields sensed at at least two of the sensing positions during the measurement time duration; and (iii) demodulating the differential magnetic field time profile (Continued)

in accordance with the displacement function to thereby determine a demodulated time profile indicative of the at least one vector component of the gradient of the measured magnetic field.

20 Claims, 10 Drawing Sheets

(51) Int. Cl.
*G01V 3/08* (2006.01)
*G01V 3/165* (2006.01)
*G01V 3/38* (2006.01)

(56) References Cited

U.S. PATENT DOCUMENTS

| | | |
|---|---|---|
| 2004/0263162 A1 | 12/2004 | Kandori et al. |
| 2007/0120563 A1* | 5/2007 | Kawabata .............. G01R 33/26 324/244.1 |
| 2010/0225313 A1* | 9/2010 | Blanz .................... G01R 33/26 324/303 |
| 2011/0031969 A1* | 2/2011 | Kitching ............ G01R 33/0286 324/304 |
| 2011/0193555 A1 | 8/2011 | Sugioka et al. |

OTHER PUBLICATIONS

Hovde, et al., Sensitive optical atomic magnetometer based on nonlinear magneto-optical rotation, Visual Communications and Image Processing, Proc. of SPIE, 2004, pp. 1-10, vol. 7693.

* cited by examiner

(GENERAL ART)

(GENERAL ART)

GRADIOMETER SYSTEM AND METHOD

TECHNOLOGICAL FIELD

The present invention is in the field of magnetic field sensors and particularly relates to a magnetic gradiometer system for measuring the gradient of magnetic fields.

BACKGROUND

Magnetic surveys are surveys conducted by using magnetometers (magnetic sensors) to measure and record the intensity of the magnetic field at the sensor, while scanning the region to be surveyed by the sensor. Magnetic surveys are used for various purposes in which detection of objects/anomalies having magnetic properties is needed. For example, common such surveys are performed by hand-held magnetic sensors (magnetometers) to detect objects (e.g. metallic objects) located/buried at shallow depths beneath the soil/ground. Other such surveys are aerial magnetic surveys performed from an altitude by aircrafts to obtain geophysical mapping of the Earth (for example to detect and map the spatial distribution and relative abundance of magnetic minerals such as iron oxide and magnetite) in the upper levels of the Earth's crust. The principles of such aerial magnetic surveys are similar to a magnetic survey carried out with a hand-held magnetometer, but allowing much larger areas to be covered quickly. The aircraft typically flies in a scanning pattern/path (e.g. grid-like pattern with height and line spacing determining the resolution of the survey/magnetic-map data).

GENERAL DESCRIPTION

There is a need in the art for a novel approach to magnetic field measurement, by scanning/mapping a region of interest with a magnetic field sensor.

Since different materials may differ in their compositions and therefore in their magnetic properties, a magnetic map allows to visualize the composition of the surveyed object/surface (e.g. the Earth) and to identify magnetic-objects/magnetic-anomalies above certain magnetic-reply, which are located/buried up to a certain depth within the scanned object.

It should be noted that the phrase magnetic-reply (also generally known as magnetic response) is used herein and in the following to indicate the strength of the effect that an object/anomaly/irregularity has on the magnetic field surrounding it. For example, an object of a given size, comprised of materials with magnetic permeability much higher than the ambient environment in which it is situated (e.g., buried), will have much stronger magnetic reply than smaller objects of the same permeability or objects of similar size that include material compositions having permeabilities closer to that of the ambient environment.

To this end, different magnetic survey techniques may impose different limitations on the maximal depth/distance of the magnetic-objects/magnetic-anomalies they can detect below the scanned surface, the minimal size/magnetic-reply of the magnetic-objects/magnetic-anomalies they can detect, and the resolution of the detection. This is dependent on the sensitivity of the magnetic-sensors used for the survey, the height/distance, (or the distribution of the distances above and below the surface) of the object above which scanning is performed; the spatial extent of the scan, and the time duration of the scan (associated with the velocity of a scanning platform).

For instance, hand-held magnetic surveys performed from a low altitude above the surface and over a relatively small spatial extent, may be limited to detection of relatively small magnetic objects which have relatively high magnetic reply (such as ferromagnetic metal pieces) and which are located/buried at shallow depth beneath the surface. On the other hand, aerial magnetic surveys performed from a high altitude and over a relatively large spatial extent may be limited to detection of relatively large magnetic objects, such as geological deposits of magnetic minerals, which are located/buried at greater depth beneath the surface. Indeed, in magnetic survey techniques, sensitivity of the magnetic sensors has significant impact on the ability of the technique to detect small objects, with lower magnetic reply located/buried at a higher depth beneath the surface.

There is a need in the art for magnetic field survey techniques capable of detecting relatively small anomalies/irregularities located/buried at various depths beneath the Earth's surface. Such systems are needed, for example, for detection of unexploded ordnances (UXOs) and for border protection, to detect various threats which may be hidden below ground.

Contemporary aerial magnetic survey techniques, which are carried out from a great height above ground and which cover relatively large ground areas, are generally suitable for detection of mineral deposits in the soil (which occupy relatively large volumes and have relatively high total magnetic reply). However such aerial magnetic survey techniques generally lack the sensitivity and resolution to reliably detect such threats as indicated above, which may be typically associated with relatively small sizes (e.g. in the order of a few decimeters to a few meters) and/or with relatively low total magnetic reply, (e.g. as compared to mineral deposits).

Conventional ground level magnetic survey techniques, which are performed at ground level, also do not provide sufficient sensitivity for detection/reliable-detection and location of such threats. This, among others, is due to internal noise of the magnetic sensors (hereinafter also referred to interchangeably as magnetometers), which commonly behaves as "1/f noise" (i.e. noise whose intensity is inversely proportional to some order of the frequency 'f') and therefore increases rapidly with the measurement of anomalies that change at frequencies close to DC. Since in practical implementations the ground level surveys of static/buried objects are performed at relatively low velocities (e.g. in the order of 10s of kilometers per hour), recording changes at very low rates/frequencies is associated with significant values of the 1/f internal noise. This deteriorates the signal to noise ratio (SNR) of the measurements, thus impairing measurement sensitivity to a level aggravating reliable detection of threats such as those indicated above.

For instance, scalar atomic magnetometers (hereinafter also referred to as vapor cell based (magnetic) sensors) are optical magnetometers, which utilize radiation pumping means (optical radiation typically from a laser source) to optically pump and alter the spin polarization of the atoms (e.g., alkali atoms) in the vapor cell to affect precession thereof in accordance with the torque exerted thereon by the magnetic field, and optical detection means (such as a photodetector) for detecting the evolved atomic spin polarization state through the effect exerted by the polarized atoms on light propagating through the atomic medium in the vapor cell. To this end, scalar atomic magnetometers/sensors generally include a vapor cell (typically a glass tubing) enclosing a certain predetermined substance composition (typically including certain population of vaporized Alkali atoms and buffer gases) and a magnetic field/magnetometer sensing assembly, whose typical configuration of a so called Bell-Bloom laser setup is coupled to the vapor cell for pumping and detecting the radiation/laser across the vapor cell. The signals from the photodetector are processed to detect the scale of the Larmor precession (frequency) with the ground-state spin polarization of the vaporized alkali atoms, which is indicative of the magnetic field. More specifically, determining the amplitude of the ambient magnetic field |B| is done by measuring the Larmor precession $w_L$ frequency of atomic spins of alkali atoms (according to the relation $$|B| = \frac{w_L}{\gamma}$$

where $\gamma$ is gyromagnetic ratio). In general, a scalar magnetometry requires coherent precession of the atoms spin ensemble, so a resonant excitation must be applied in order to force some large fraction of the atoms to precess together simultaneously with a common phase, keeping/stimulating the excitation frequency matched to the Larmor precession frequency. Otherwise the phase of individual atoms is random, and the total transverse spin of the ensemble averages to zero. This can be accomplished modulating the near-resonance signal and keeping the response locked to the central zero-crossing.

However, due to 1/f noise components in the measurements, for most practical cases, in order to be able to properly measure (and/or track) even small magnetic field variations, the magnetic field needs to be sufficiently sampled (sampled often enough to properly represent the detailed shape of the anomaly and prevent "spatial aliasing"). This is illustrated in a self-explanatory manner in FIG. 1A showing a graph depicting the spectral density of the 1/f noise from a scalar magnetic sensor as a function of the frequency, and the 1/f function graph provided as a reference.

To this end, many magnetic survey techniques, particularly ground level magnetic survey techniques, require operation of magnetic sensors at frequencies lower than 1 Hz (hereinafter also referred to as measurement frequency) where, as can be seen from FIG. 1A, the 1/f noise is often dominant. Thus in such cases where scalar magnetic sensors are used for ground level magnetic surveys, the 1/f noise plays a significant role in deteriorating accuracy and SNR of the survey when the bandwidth of the measurement is low.

In most regions of the Earth's surface, the magnetic field is in the order of about 25 to 65 micro-Tesla. For the purpose of threat detection and location, as may be required for example for border protection and/or UXO detection, capability to detect minute variations in the magnitude of the Earth's magnetic field is required, in order of nano-Tesla or less (e.g. 0.5-1 nano-Tesla). Namely, to facilitate such detection, highly accurate magnetic field measurements with signal to background ratio in the order of $10^{-6}$ is required. To this end, magnetic sensors providing SNR of in the order of 60 dB or higher are needed. Also mapping the magnetic field for the Earth with such accuracy requires use of magnetic sensors that can provide and maintain this accuracy/SNR during the time duration of the measurement/mapping.

Indeed, there are some conventional magnetometers, such as SQUID type magnetometers, which may provide such accuracies. However, these types of magnetometers are often cumbersome and costly, and/or require specific operation conditions, such as cryogenic cooling, which make them less suitable for outdoor use (for non-laboratory use). Also the harsh conditions associated with such tasks of border protection and threat detection makes it impractical to use such magnetometers, due to their wear rate, their cost and the specific operation conditions they require.

The present invention solves this problem by providing a novel technique of mapping the magnetic field of the Earth with high accuracy and sensitivity. The technique of the invention permits to conduct such mapping at ground level (namely by translating the measurement system and heights of about a few meters above or below ground at the conventional speeds of terrestrial vehicles), while still providing the required accuracy and SNR of the measurements.

This is achieved by utilizing a novel magnetic field gradiometer system and method which is capable of operation with high accuracy to map the gradient of the magnetic field of the Earth. More specifically, according to the invention, the gradiometer includes one or more scalar magnetic sensors connected to a sensing actuation module/s that varies their sensing positions in a known fashion (i.e. according to a known displacement function).

Scalar magnetic sensors (like other types of magnetometers) suffer from so called 1/f noise, deteriorating their accuracy and SNR when the bandwidth of the measurement is very low, and therefore conventional gradiometry measurements techniques are ineffective for detection of slowly changing magnetic anomalies, e.g., in the order of ~1 Hz. This is mostly due to systematic 1/f noise (for each magnetometer), which is high for slow events, thus limiting operation.

It should be noted that in the following description the terms gradiometer and/or gradiometry are used herein to generally indicate systems and methods/techniques for measuring the gradient of a magnetic field, or one or more vector components thereof. This may be achieved for example by measuring the magnetic field at two or more locations and utilizing the difference between those magnetic field measurements to calculate one or more vector components of the gradient of the magnetic field.

The present invention, in at least some of its aspects, is based on the inventors' understanding that in gradiometer systems, the 1/f noise limit of magnetic sensors can be exceeded without increasing the speed of the relative movement between the gradiometer system and the object/anomaly of interest, by moving the sensing positions of the magnetic sensor (i.e., relative to one another). Indeed the inventors noted that such movement of the sensing positions of the sensors relative to one another would have the same effect as passing the anomaly faster, and, accordingly, the 1/f limit for the sensitivity would be lowered.

Therefore, according to the technique of the present invention, a novel gradiometer configuration of the scalar magnetic sensor(s) is used which facilitates to distinguish between a gradiometer signal sensed/acquired by the sensor(s), and their noise, and diminish the effects of the 1/f noise. This can be achieved by varying the sensing positions of the one or more scalar sensor(s) in a known fashion, such that the displacement of the sensing positions from a reference position, about which the gradiometer signal should be obtained, follows a known displacement function (whereby the displacement function indicates the displacement between the spatial sensing positions and function of time). It can be achieved by using only one scalar sensor which, alternatively, or can be kept at the fixed location, or moved. In each case it is sampled in accordance with the predominate displacement function(s). For one "moving" sensor the differential measurements are taken with respect to different locations of the sensor or sensing positions thereof. The use of only one sensor has an obvious advantage in the sense of the internal noises that are kept constant and non-modulated and thus can be easily subtracted. In the case more than one sensor are used, the better the correlation between the sensors the higher the noise reduction, and therefore better response is provided.

According to various embodiments of the present invention varying the sensing positions of the sensors is achieved by at least one of the following: mechanically or virtually moving the one or more sensor(s) to different positions according to the known displacement function and operating such sensor(s) to sense the magnetic field at these positions, and/or utilizing a large (e.g. lengthened) multi-point scalar magnetic sensor which includes a large vapor cell accommodating a plurality of spaced apart magnetic sensing regions thereon and operating the large multi-point scalar magnetic sensor for sensing the magnetic field at different sensing positions according to the known displacement function.

A gradiometer measurement (signal/data) can thus be obtained by taking the difference between the signals obtained from one or more sensing positions by the one or more sensors. To this end, the signal(s) obtained from the different sensing position(s) (by the movement of the one or more sensors, or from different sensing points/regions in one sensor is therefore modulated (spatially and possibly also in time) by the known displacement function, which is indicative of the change in the sensing positions. Accordingly, this difference signal/data is distinguishable from the internal noise of the sensors, which does not modulate with the change in the sensing positions. Therefore, by taking the difference between the signals obtained from the one or more sensors in accordance with the known displacement function presenting an actual or virtual movement of the sensors (change in the sensing position/s), a gradiometer signal may be obtained while filtering out substantial parts (most or all) of the internal noise (e.g. 1/f noise) of the magnetic sensors. This provides for using the scalar magnetic sensors to obtain an accurate gradiometer signal with sufficiently high SNR (e.g. $\sim$−60 dB) permitting highly accurate mapping of the gradient of the magnetic field of the Earth.

It should be noted that the inventors of the present invention contemplated using various types of magnetic sensors for the purpose of the magnetic field mapping discussed above. The inventors considered for example the use of vector magnetic field sensors, pseudo-scalar magnetic field sensors, which are formed by three vector magnetic field sensors aligned along the Cartesian axes such that the magnitude of the magnetic field can be determined by summing their detected vector components of the magnetic field, and using scalar magnetic field sensors, such as some atomic sensors (e.g. vapor-cell based sensors) which directly measure the magnitude of the magnetic field. To this end, the use of magnetic field sensors based on measurement of the vector components of the magnetic field (e.g. such as vector magnetic field sensors and the pseudo-scalar magnetic field sensors) was found to provide poor results and poor SNR due to inaccurate alignment of the sensors along the measurement axes. More specifically, for the high accuracy measurements indicated above, alignment accuracy in the order of millidegree or better, should be obtained and maintained during the measurement. However, such alignment accuracy is difficult to obtain and maintain, specifically when outdoor/field operation is considered under varying temperature conditions and/or mechanical conditions (e.g. vibrations), and would require performing periodic adjustments and calibration procedures, which may be not possible or not practical, specifically when relatively long duration of the measurement sessions is required for mapping the ground.

Therefore, according to the present invention, scalar magnetic sensors (such as optically pumped atomic vapor-cell magnetic field sensors) are used to obtain a gradiometer signal with the desired high accuracy. Indeed, these types of magnetometers have areas (angular zones/orientations) of reduced sensitivity (e.g. insensitivity) which are known as dead zones, also referred to herein as dead sensing angular zones, and areas in which the magnetometers are sensitive, which are often referred to as active zones or active sensing angular zones. Should a magnetic field vector pass in the direction of a dead zone of the sensor, the sensor will not be able to measure its strength. For instance, in certain Cesium sensors, the dead zone includes a cone defined by a half-angle of ~8°, about the longitudinal/polar axis of the sensor, and also the same about the equator of the sensor, thus giving an active zone of approximately 74° measured from the polar axis to the equator of the sensor.

To this end, in order to obtain accurate and reliable measurements of the magnetic field using scalar-type magnetic sensors (e.g. vapor cell based sensors), the orientation of the sensor is maintained such that the direction of a magnetic field being measured is within the active zone of the magnetic sensor used. For instance, when mapping the gradient of the magnetic field of the Earth by the gradiometer system of the invention, the scalar sensors used in the system are oriented such that the Earth's magnetic field vector passes through the active zones of the sensors.

It should be noted that in addition to the dead zones, also within the active zones the sensitivity of scalar vapor cell based magnetometers (sensors) is susceptible to (i.e. depends on) changes of the orientation of the magnetic field. Changes, fluctuations, and/or difference, in the orientation of the sensor relative to the magnetic field, and might result with a so called heading errors, impairing the SNR of the signal obtained from the sensor.

Heading errors are orientation dependent shifts of the measured resonance frequency due to the changes in the magnetic field orientation that alter the resonance spectrum. In general the energy levels (Zeeman splitting) of the alkali atoms are non-linear with the magnetic field strength and so are the corresponding transition strengths. This non-linearity is large enough, even in magnetic field of the Earth (~0.5 G), to affect the overall performance of the magnetometer.

If the magnetic field orientation is not well known or is unstable, then the heading error places a limit on the accuracy of a scalar magnetometer. Most existing scalar alkali-metal magnetometers have heading errors in the order of 1-10 nT. However, since these magnetometers have an overall sensitivity in several pT/$\sqrt{Hz}$, heading errors can completely obscure the real magnetic response.

No practical sensor design can assure completely uniform distribution of materials. This means that no matter what technology is used to make the measurement, some heading error will always exist in each particular sensor due to its various orientations with respect to the magnetic field. This means that magnetometer performance is somehow limited by its specific structural design, thus making the magnetic field measurements thereby somewhat dependent on the magnetic field orientation relative to the sensor. This also means that different sensors inherently possess different heading errors, thus introducing greater overall sensitivity threshold, limiting system performance. When using a single sensor for measuring the magnetic field, changes might be relatively small and negligible. However in cases where spatial gradiometry is performed by utilizing two sensors, if they are not similar and correspondingly situated/oriented in space, these changes might cause appreciable noise.

This is because a scalar magnetometry (based on atomic precession measurements) requires coherent precession of the spin of an ensemble of atoms (e.g. in a vapor cell). Resonant excitation is therefore pumped to the atoms to force a large fraction thereof to precess together simultaneously with a common phase, striving to maintain the excitation frequency matched to the Larmor precession frequency. In this state, the precession signal (a signal indicative of the atoms precession) measured/probed, is indicative of the magnetic field sensed by the atoms. The precession signal is largest when the magnetic field is orthogonal to both the pump and probe directions, and it drops to zero as the field becomes parallel to either of the pump and probe directions. This results in a dead-zone of the sensor (whose magnetic field is generally not sensed thereby) and with heading errors, associated with the sensor's sensitivity being dependent on orientation of the sensor.

To this end, in some embodiments of the present invention, in which more than one sensor is used for performing gradiometric measurements, the sensor's orientation is preferably maintained/adjusted (e.g. utilizing orientation adjustment and stabilization mechanism) such that the magnetic field to be measured is directed within the active zone of the sensors, and preferably such that orientation of the sensors does not fluctuate by more than 1% relative to one another, even while the platform carrying the sensor moves (e.g. is driven on the ground).

In addition to 1/f noise and heading errors, which may affect the SNR of the measurement, an additional noise component, generally known as gradiometry methodological noise, concerns the gradiometry measurement method, when samples of two separate signals are subtracted to reduce the common background signal and obtain their gradient signal caused by the small variations from the sensors running on the same background. However, due to the fact that different sensors are never the same, gradiometry methodological noise is cumulative noise in its nature. In gradiometry measurements which are acquired by utilizing two or more scalar vapor cell based sensors (hereinafter also referred to as atomic magnetic field sensors and/or atomic sensors) this noise is introduced because each atomic sensor is generally characterized by its unique specific characteristic noise floor limit, which depends on its physical structure, including the dimensions and the interrelations of the materials within the vapor cell of the sensor. Therefore, conventional gradiometric operations which utilize two (possibly more) atomic sensors are generally limited by cumulative characteristic noise sourced from the separate sensors.

More specifically, in atomic magnetometers, which rely on a measurement of the Larmor precession of spin-polarized atoms in a magnetic field, the fundamental, shot-noise-limited sensitivity of an atomic magnetometer is given by $$\delta B = \frac{1}{\gamma\sqrt{n\tau V t}},$$

where n is the number density of atoms, γ is their gyromagnetic ratio, τ is the transverse spin relaxation time (which is usually limited by spin-exchange and collisions as between alkali atoms themselves as well as their collisions with atoms of the buffer gas in the vapor cell), V is the effective interaction volume, and t is the measurement time. In general this means that each atomic (vapor cell based) sensor is characterized by unique characteristic noise floor limit which depends on the dimensions and the interrelations (e.g. partial pressures) of the materials/gases within the cell. Accordingly, conventional gradiometric measurements are generally also limited by the cumulative characteristic noise sourced from the separate sensors used in the measurement.

Thus, in order to resolve that and reduce the level of cumulative noise obtained in the gradiometry measurements, the present invention according to some embodiments thereof, provides a technique for performing gradiometry measurements by utilizing a single vapor cell (a single atomic sensor). The technique of the present invention enables using the single sensor for sensing the magnetic field at different sensing positions, thereby reducing/suppressing cumulative noise in the gradiometry signal obtained from the measurements.

As indicated above, in order to significantly filter-out/diminish the internal (1/f) noise of the sensor(s) from the gradiometer measurement output, the sensing positions are varied in a known fashion (according to a known displacement function), thereby causing spatial modulation of the differential signal obtained from the sensor/s.

Considering the dead and active zones of the scalar sensors used in the gradiometer system/method of the invention, the actuation module is configured such that while varying/translating the respective sensing position(s) of the scalar magnetic sensor(s), the orientation of the sensor(s) is maintained such that the direction of the magnetic field that is to be sensed thereby (e.g. the Earth's magnetic field) passes through the active zone of the sensor/s and does not drift to the dead zone during sensor movement. Preferably the orientation of the sensor(s) is maintained substantially fixed, not exceeding variation of more than the order of a few degrees during the gradiometry measurements so that heading errors are also reduced/minimized.

Accordingly, while surveying the magnetic field of the Earth with the gradiometer system of the invention, the sensing positions(s) are moved to obtain modulated differential reading of their signal, while during such movement the correct sensor orientation is maintained with respect to the surveyed magnetic field. Moreover, for the single cell gradiometer, different sensing positions are similarly oriented within the same sensing volume, therefore even if the whole sensor moves, the effect on the relative intra-sensors variations is negligible.

It is generally known and exemplified in FIG. 1B, that the general direction of the Earth's magnetic field vector varies depending on the geographic location (latitude) at which the survey is performed. FIG. 1B shows the curves of equi-direction of the magnetic field relative to the horizon. As can be seen, for example at the temperate zones of the northern hemisphere of the Earth, i.e. Middle East, Europe, and North America, the magnetic field lines are directed with an inclination of about 35° to 55° from the horizontal. At the magnetic poles, it is 90° and at the magnetic equator it is 0°.

To this end, in certain embodiments of the present invention, the sensors are mechanically coupled to a mechanical sensing position actuation module which is adapted to move the sensors to different sensing positions, according to a known displacement function, while maintaining their active zone in the general direction of the Earth's magnetic field in the regions of the Earth where magnetic survey is sought. For example, the mounting orientation of the sensors on the actuation module is adjustable, allowing setting-up of the correct orientation of the magnetic sensors. In any case, the actuation module is configured such that the orientation of the magnetic sensors is maintained substantially stable, when the sensors are moved, such that accurate reading is obtained.

In some implementations, two or more magnetic sensors (e.g., atomic magnetic sensors) are used and/or are operated to obtain the signals from the different sensing positions simultaneously. Accordingly, in such embodiments, a modulate gradiometer signal is obtained by processing the signals from the two sensors (e.g. by subtracting one from the other). Alternatively or additionally, in some embodiments a single atomic sensor is used and is moved/actuated to the different sensing position in a timely fashion. Accordingly in this case the modulate gradiometer signal is obtained by processing the signal from the single sensor (e.g. by subtracting the signal from a time shifted copy thereof, shifted by a proper time delay corresponding to the time of movement of the sensor in between different predefined (e.g., extremum) sensing positions of the known displacement function). In case of the single sensor arranged in this way, the cumulative noise is suppressed (since only a single sensor is used), however in some cases additional noise, associated with time variation of the sensed magnetic field with characteristic time scale shorter than the above indicated time delay, might be introduced to the measurements.

Alternatively or additionally, in certain embodiments of the present invention, the atomic sensor used in the invention is a large multi-point scalar magnetic sensor which includes a large vapor cell with a plurality of spaced apart magnetic sensing regions thereon at which the precession frequency of the atoms within the vapor cell can be probed. An example of such a multi-point scalar magnetic sensor is described for example in magnetic sensing regions in PCT patent publication No. WO 2012/038948 which is assigned to the assignee of the present application and included herein in its entirety by reference. According to this embodiment, the multi-point scalar magnetic sensor is coupled to a sensing position actuation module, being an mechanical and/or electronic/computerized module, which is adapted to move the sensing positions by either moving the sensing sites which are coupled to the large vapor cell, according to the known displacement function, and/or providing the controller instructions to selectively acquire signals from the different magnetic sensing sites of the sensor to thereby obtain the measured magnetic field at different sensing positions according to the known displacement function. This can be implemented, for example, by manipulating the pumping/probing laser signal to be sequentially transferred/reflected throughout the vapor cell. Accordingly, in this case, the modulate gradiometer signal is obtained by processing the signal from the single sensor. Also signals from several (e.g. two) sensing positions may be acquired simultaneously thereby enabling to obtain accurate gradiometer measurement (e.g. by subtracting one signal from the other) even in cases where the magnetic field to be sensed rapidly varies in time.

Furthermore, cumulative errors are diminished since a single (though large) vapor cell is used, to acquire/sense the magnetic field in the different sensing positions. This allows to utilize a plurality of sensing positions (e.g. even much more than two, for instance 10 sensing positions) and to construct a modulated gradiometer signal by each, utilizing, at each time, a different pair of the sensing positions from the plurality of magnetic field sensing signals (from different channels) which can be continuously sensed and sampled at different modulations and timing and at different spatial sensing positions (subtracting the signal of one from the other), as if, virtually, the magnetic field is sensed by two (or more) moving sensors. This allows to obtain highly accurate gradiometer measurements, whereby the 1/f noise included therein can be subtracted or diminished. Also in this case heading errors can be reduced/diminished by using proper orientation adjustment and a stabilization mechanism to stabilize the orientation of the entire multi-point scalar magnetic sensor, while the platform carrying it may be moving. Yet additionally, using the large multi-point scalar magnetic sensor allows, in some implementations, to electronically control the positions at which the magnetic field is sensed and possibly virtually moving/actuating the sensing position at practically any desired speed, without mechanical constrains. This enables to overcome the low frequencies (slow object movement) limitation by virtually translating the sensing diapason to the higher frequencies range. In the case of a large vapor cell equipped with a number of sensing ensembles, this effect can be achieved and accomplished without any actual mechanical movement. This therefore enables to obtain a rapidly modulated gradiometer signal, at higher sensing frequencies, where 1/f noise does not limit performance, due to its reduced or practically negligible values at higher frequencies.

Thus, according to a broad aspect of the present invention there is provided a gradiometer system (hereinafter also referred to by gradiometer) including one or more magnetic sensors for sensing a magnetic field in their vicinity, and an actuation module that is connectable to the one or more magnetic sensors and configured and operable to vary the one or more sensing positions at which the magnetic field is sensed by the one or more sensors, such that the one or more sensing positions are varied according to a certain (e.g. known/predetermined) displacement function indicative of a displacement between the sensing positions as a function of time. The gradiometer system also includes a controller that is configured and operable for determining at least one vector component of a gradient of the magnetic field by carrying out the following:
    a. obtaining, from the one or more sensors, readout data indicative of the magnetic field sensed at the sensing positions during a certain measurement time duration at which the sensing positions are varied;
    b. processing the readout data to determine a differential magnetic field time profile indicative of a difference between magnetic fields sensed by the at least two of the sensing positions during the measurement time duration. To this end, the differential magnetic field time profile provided in this way is indicative of at least one vector component of a gradient of the magnetic field modulated by the displacement function; and
    c. demodulating the differential magnetic field time profile in accordance with the displacement function, to thereby determine a demodulated time profile that is indicative of the at least one vector component of the gradient of the magnetic field, but has reduced noise.

As indicated above, typically in various implementations of the present invention, the one or more magnetic sensors are associated with 1/f noise. The 1/f noise can be suppressed according to the present invention, since the operation of the actuation module to vary the sensing positions with certain periodicity, results in a differential magnetic field time profile which includes a signal component which is modulated with the certain periodicity, which is indicative of the gradient of the magnetic field, and a noise component which is at least partially associated with the 1/f noise and is not modulated. This enables to utilize the demodulating to obtain/extract the signal component (which is indicative of the gradient of the magnetic field during the certain measurement duration), while diminishing/suppressing the noise component.

According to some embodiments of the present invention the one or more magnetic sensors are one or more scalar atomic magnetic sensors associated with a vapor cell. Indeed in some cases the magnetic field measurements that are obtained from the scalar atomic magnetic sensors, are susceptible to heading errors associated with an angular dependence of the magnetic field measurements by sensors on the relative ordination between the magnetic field and the sensors. Therefore in some embodiments the actuation module is configured to vary the respective sensing positions of the sensors, while maintaining similar relative orientations between the one or more sensors at the one or more sensing positions and the magnetic field, such that cumulative heading errors sourced by variations between the orientations of the one or more sensors and the magnetic field are suppressed from the differential magnetic field time profile.

According to some embodiments of the present invention the one or more magnetic sensors include a multipoint atomic sensor including a large vapor cell with a plurality of sensing sites coupled (fixedly or movably coupled) at different places to the large vapor cell. For instance, each sensing site of the plurality of sensing sites serves as a magnetic field sensing channel and includes a magnetometer assembly including a Bell-Bloom laser setup optically coupled to the large vapor cell. The Bell-Bloom laser setup may include: a radiation port for pumping a laser to excite the spins of alkali atoms in the vapor cell, and a probe for sensing a radiation response from the vapor cell being indicative of a Larmor precession of the spins of the alkali atoms that is associated with the magnetic field. The magnetometer assembly may also include one or more optical deflectors arranged to deflect an optical path of a laser beam from the Bell-Bloom laser setup, such that the laser beam traverses the large vapor cell several times, and from different angles, before reaching the probe of the Bell-Bloom laser setup. This thereby provides for reducing or entirely eliminating an angular extent of a dead zone of the magnetometer assembly.

In some embodiments, the large vapor cell includes at least one tube-like arm extending along at least one respective axis associated with a certain spatial dimension, along which the gradient of the magnetic field is to be measured. In this case the sensing sites may include one, two or more sensing sites that are optically coupled in at least two sensing positions to the at least one arm along the axis such that the differential magnetic field time profile obtained from a difference between magnetic fields sensed by said two or more sensing sites is indicative of a vector component of the gradient of the magnetic field along the axis. For instance, according to some embodiments, the gradiometer system is configured as a multi-dimensional gradiometer system and is operable for measuring the vector component of the gradient of the magnetic field along two or three spatial dimensions. In such embodiments the large vapor cell may respectively include two or three tube-like arms extending along respective two or three spatial axes associated with the two or three spatial dimensions along which the magnetic field gradient should be measured. The sensing sites may include sensing sites that are optically coupled to the vapor cell in at least two sensing positions along each of the axes such that differential magnetic field time profiles obtained from a difference between magnetic fields sensed by two or more sensing positions are indicative of vector components of the gradient of the magnetic field along the two or three axes.

According to some embodiments of the present invention, one or more of the sensing sites are mechanically coupled such that they are movable with respect to the large vapor cell, to thereby enable varying the sensing positions of the one or more sensing sites by moving them along the vapor cell such that they can be optically coupled at different sensing positions along the large vapor cell. In this case the actuation module includes a mechanical assembly coupled to the one or more sensing sites and configured for moving them in between the one or more sensing positions in accordance with the displacement function.

Alternatively or additionally, according to some embodiments of the present invention one or more of the sensing sites are fixedly coupled sensing sites that are fixedly coupled at fixed sensing positions along the large vapor cell. In this case the actuation module includes an electronic inter-switching mechanism that is configured and operable for selectively switching between the fixedly coupled sensing sites, from which magnetic measurements should be used at each moment, to compute the differential magnetic field time profile. To this end, the switching is performed in accordance with the displacement function and in accordance with the fixed sensing positions of the sensing sites, such that the sensing positions are varied in accordance with the displacement function, so that the desired differential magnetic field time profile can be computed.

For instance in some embodiments the fixedly coupled sensing sites are continuously operated to measure the magnetic field at their respective fixed sensing positions. In this case the inter-switching mechanism is configured and operable for varying the sensing positions, based on which the differential magnetic field time profile is computed, by switching between samples of the magnetic field measurements obtained from the fixedly coupled sensing sites in accordance with the displacement function.

Alternatively or additionally, the inter-switching mechanism is configured and operable for selectively operating the fixedly coupled sensing sites for sensing the magnetic field thereat, such that the sensing positions, based on which said differential magnetic field time profile is computed, are varied in accordance with the displacement function.

According to some embodiments of the present invention the actuation module is mechanically connected to one or more of the magnetic sensors and is configured and operable to vary their respective one or more sensing positions by actuating movement of the one or more magnetic sensors, so that their respective positions are moved according to the displacement function. For instance the actuation module may be configured and operable for actuating the one or more magnetic sensors about a certain reference plane thereby enabling to measure the gradient component of the magnetic field along an axis intersecting the reference plane. The one or more magnetic sensors may be actuated for one dimensional movement along a certain motion path intersecting the reference plane. The actuation module may be configured and operable to allow tuning of the certain motion path of the sensor to enable selection of the vector component of the gradient of the magnetic field that is measured by the gradiometer.

As indicated above, in some cases the one or more magnetic sensors include one or more scalar atomic magnetic sensors associated with active sensing angular zones, from which accurate magnetic field measurements can be obtained, and with dead sensing angular zones, at which at least one of the sensitivity or accuracy of the one or more magnetic sensors is reduced. In this case the actuation module is configured to vary the respective positions of the one or more magnetic sensors while carrying out such movement, such that the orientations of the sensors are maintained, and such that a direction of the magnetic field to be sensed thereby is within the active sensing angular zones of sensors.

To this end, in some cases the one or more magnetic sensors are connected to the actuation module via respective pivotal mechanisms that permit such maintaining/controlling of the orientation of the magnetic sensors. For instance the actuation module may include a conveyor system that is adapted for actuating the one or more magnetic sensors along at least one motion path, and the one or more magnetic sensors may be mounted to the conveyor system by the respective pivotal mechanisms, (e.g. such that the pivotal mechanisms are substantially perpendicular to the certain motion path of the conveyor system) thereby enabling to maintain the orientation of the one or more sensors during operation of the conveyor system.

According to some embodiments of the present invention the displacement function is a periodic function having a periodicity component with frequency in the order of, or higher, than Nyquist frequency of a magnetic field signal component, which is to be determined by demodulation of the differential magnetic field time profile (namely from the demodulation of the modulated gradiometry signal obtained from the system).

According to some embodiments the one or more magnetic sensors include at least one magnetic sensor that is mechanically coupled for movement by the actuation module, and the processing of the one or more time profiles includes subtracting a first time profile of the readout data from this sensor, from a second time profile, being a time shifted copy of the first time profile (i.e. shifted by a certain shift duration) and thereby determining the differential magnetic field time profile as a difference of the magnetic field sensed by the at least one magnetic sensor at different locations. In this case the demodulating includes determining the displacement data between the location of the sensor associated with the first time profile and the location of the sensor associated with the second time profile (e.g. by subtracting the displacement function from a time shifted copy thereof that is being time shifted by the certain shift duration), and demodulating the differential magnetic field time profile based on the displacement data obtained in this way. It should be noted that in this case, the displacement function may be a periodic function having a certain period, and the certain shift duration may match (e.g. be equal to) a multiplication of half of that period by an odd integer number, preferably by 1.

According to some embodiments of the present invention the one or more magnetic sensors include at least two magnetic sensors that are mechanically coupled for movement by the actuation module. The processing of the one or more time profiles includes subtracting a time profile of readout data read from first one of these sensors from a time profile of readout data read from a second one of the sensors and thereby determining the differential magnetic field time profile as a difference of the magnetic field simultaneously sensed by the at least two sensors. The demodulating includes utilizing the displacement function to determine displacement data indicative of the displacement between the at least two sensors as a function of time.

According to some embodiments of the present invention the one or more magnetic sensors include at least one multipoint magnetic sensor including a plurality of sensing sites optically coupled to a common large vapor cell. The actuation module is adapted for varying at least one of the sensing position(s) from which magnetic field measurements are obtained from said large vapor cell by at least one of: (i) mechanically moving the sensing sites with respect to the large vapor cell, and (ii) selectively electronically switching between the sensing sites from which the magnetic measurements are used for determining the differential magnetic field time profile at each moment. The respective mechanical movement and electronic switching is performed in accordance with the displacement function between the sensing position(s), to thereby obtain at least two time profiles respectively indicative of the magnetic field that is measured at the at least two sensing positions, whose displacement is varied in accordance with the displacement function. Accordingly the processing of the at least two time profiles includes subtracting one of the time profiles from another one of the time profiles to determine the differential magnetic field time profile as a difference of the magnetic field sensed simultaneously at the at least two varied sensing positions. The demodulating includes utilizing the displacement function(s) to determine data indicative of the displacement between the at least two sensing positions as a function of time and demodulating the differential magnetic field time profile based on the displacement data.

According to some embodiments the displacement function is a periodic function having certain periodicity, and the actuation module actuates the at least one sensing position(s) periodically according to the periodic function, such that the differential magnetic field time profile includes a signal component modulated with the certain periodicity and a noise component that is substantially not modulated with this periodicity. Accordingly the demodulation, applied to the differential magnetic field time profile, extracts the signal component with reduced noise.

It should be noted that the displacement function may actually be a function indicating a displacement vector of the one or more sensors as a function of time. The actuation module may be operable for carrying out one or more of the following:

a. The actuation module may be operable to vary the sensing positions in order to vary the magnitude of the displacement vector of the one or more sensors with a certain periodicity, while maintaining the direction of the displacement vector aligned along a certain axis. In this case the amplitude of the signal component of the demodulated gradiometer signal is indicative of the magnitude of the projection of the gradient of the magnetic field onto this certain axis;

b. The actuation module may be operable to vary the sensing positions so as to rotate the displacement vector about at least one rotation axis with a certain periodicity, while maintaining a magnitude of the displacement vector fixed. In this case the phase of the signal component of the demodulated gradiometer signal is indicative of a direction of the gradient of the magnetic field within a plane perpendicular to the rotation axis, and the amplitude of the signal component is indicative of a magnitude of the gradient.

According to some embodiments of the present invention, prior to the demodulation, the controller is adapted to multiply the differential magnetic field time profile by a predetermined gain function which has a frequency component whose frequency matches the certain periodicity of the displacement function, and whose phase is selected to enhance sensitivity of the gradiometer to magnetic gradients aligned with particular direction and suppress sensitivity of the gradiometer to magnetic gradients aligned towards other directions.

According to some embodiments of the present invention the gradiometer system includes, or is coupled-to/mounted-on, a movable platform which carries the one or more magnetic sensors. The gradiometer system is configured and operable for detecting and locating magnetic irregularities/anomalies within an object (e.g. the Earth), by moving/driving the movable platform over at least a portion of a surface of the object, while operating the one or more sensors and the actuator module to apply passive gradiometer scanning to at least a portion of the surface, to obtain mapping information indicative of the gradient of the magnetic field sensed during the gradiometer scanning, and processing the mapping information to identify magnetic field patterns indicative of the magnetic irregularities within the object. Preferably, in various implementations of the invention, the platform includes substantially non-magnetic materials, so that accurate detection of the magnetic irregularities is facilitated.

According to yet another broad aspect of the present invention there is provided a method for measuring magnetic field gradients. The method includes operating one or more magnetic sensors for sensing magnetic field during a certain measurement time duration, while varying the sensing positions of the one or more sensors according to a displacement function (being indicative of a displacement between the sensing positions as a function of time), and determining at least one vector component of the gradient of the magnetic field by carrying out the following:
  a. obtaining, from the one or more sensors, readout data indicative of the magnetic field sensed at said sensing positions during a certain measurement time duration at which said sensing positions are varied according to the displacement function;
  b. processing the readout data to determine a differential magnetic field time profile indicative of a difference between magnetic fields sensed in at least two of the sensing positions which are varied during the measurement time duration; and
  c. demodulating the differential magnetic field time profile in accordance with the displacement function thereby determining demodulated time profile indicative of at least one vector component of the gradient of the magnetic field with reduced noise.

In some embodiments of the method, the one or more magnetic sensors may include at least one multipoint magnetic sensor including a plurality of sensing sites optically coupled to a common large vapor cell. Accordingly, varying the sensing positions may include varying at least two sensing positions on the large vapor cell, by at least one of: (i) mechanically moving the sensing sites with respect to the large vapor cell; and (ii) selectively electronically switching between the sensing sites from which the magnetic measurements are used for determining the differential magnetic field time profile at each moment. It should be noted that the respective one of the mechanical movement and/or electronic switching, provide a displacement function between the sensing position(s). Accordingly the processing of the at least two time profiles includes subtracting one of the time profiles from another one of the time profiles to determine the differential magnetic field time profile, demodulating the differential magnetic field time profile based on the displacement function.

In some embodiments of the method, the one or more magnetic sensors include at least two magnetic sensors that are mechanically coupled for movement. In this case varying of the sensing positions includes moving the at least two sensors to vary a displacement between them in accordance with the displacement function. The processing includes subtracting a time profile of readout data read from first one of the sensors from a time profile of the readout data obtained from a second one of the sensors to thereby determine the differential magnetic field time profile as a difference of the magnetic field simultaneously sensed by the at least two sensors at different locations, and wherein demodulating includes utilizing the displacement function to determine displacement data indicative of the displacement between the at least two sensors as a function of time and demodulating the differential magnetic field time profile based on the displacement data.

In some embodiments of the method the one or more magnetic sensors include one magnetic sensor that is mechanically coupled for movement. Varying the sensing positions includes moving the sensor in accordance with a displacement function; and the processing includes subtracting a first time profile of the readout data from the sensor from a second time profile, being a time shifted copy of the first time profile, shifted by a certain shift duration, to determine a differential magnetic field time profile; and demodulating the differential magnetic field time profile based on displacement data indicative of the displacement/difference between the locations of the sensor during the first and second time profiles.

The present invention thereby provides a novel gradiometer system and method, enabling accurate measurements and mapping/scanning of magnetic fields. The technique of the present invention is described and exemplified in further detail with reference to the drawings in the detailed description section below.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which.

DETAILED DESCRIPTION OF EMBODIMENTS

Figure 2A:
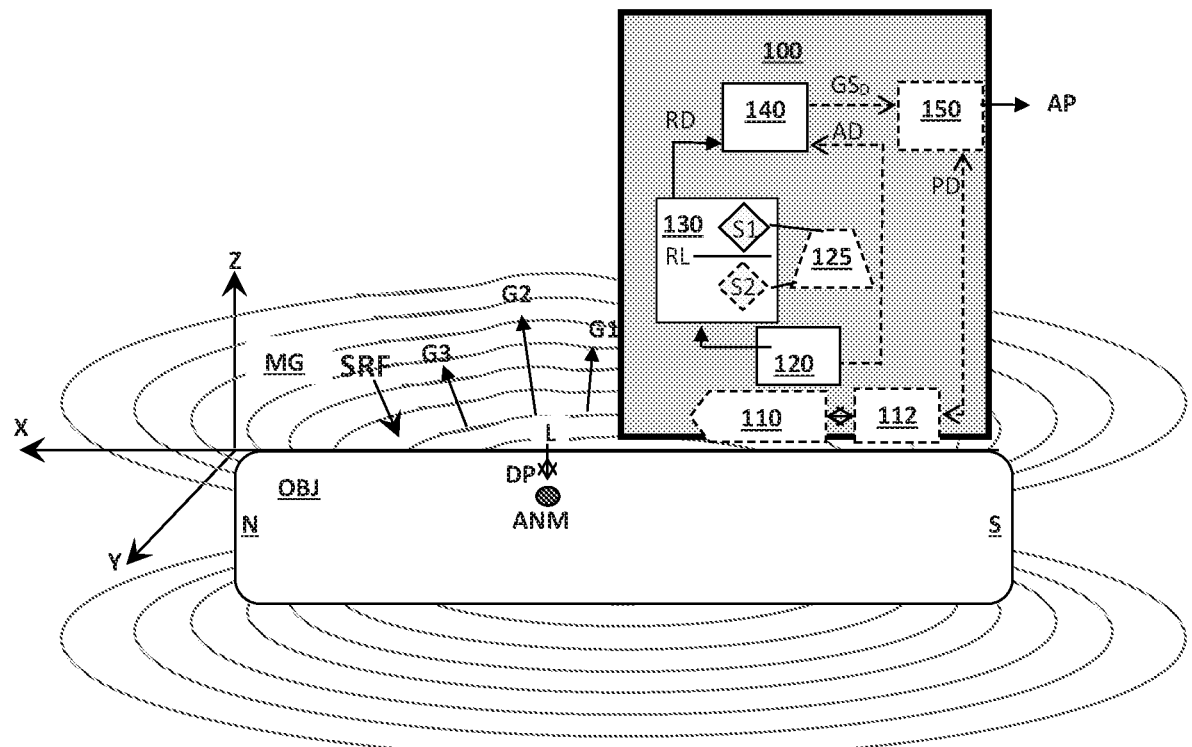
FIG. 2A is a block diagram schematically illustrating a gradiometer system according to an embodiment of the present invention in which the displacement vector between sensing positions at which the magnetic field is sensed is varied in time in order to suppress 1/f noise from the measured signal.
Figure 2B:
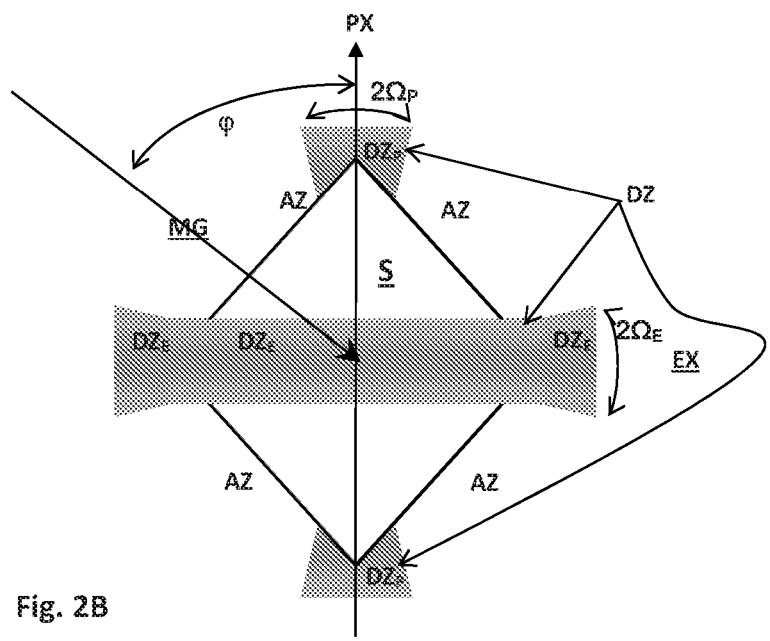
FIG. 2B illustrates the active and dead zones of a scalar magnetic sensor S used in the gradiometer system according to some embodiments of the invention.
Figure 2C:
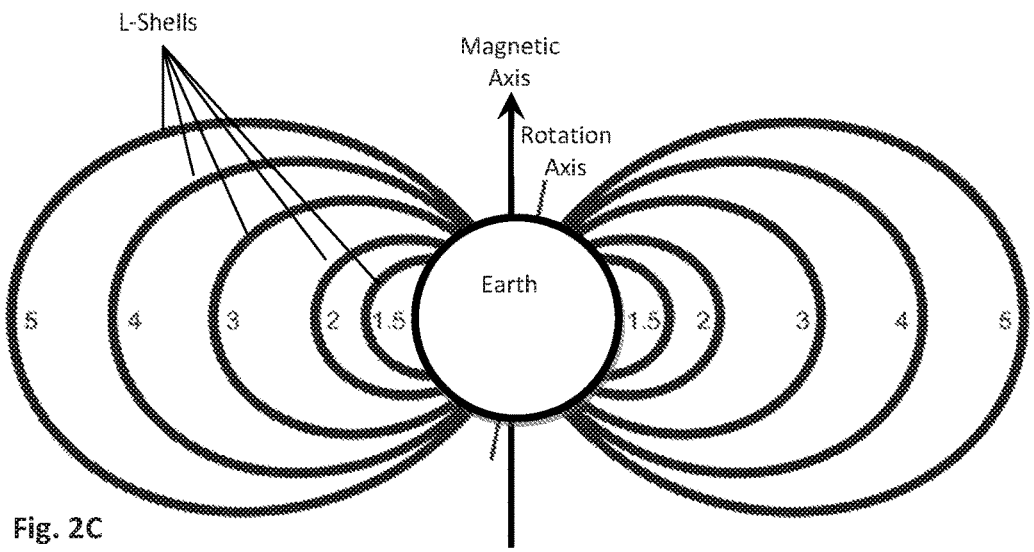
FIG. 2C illustrates L-shells of the magnetic field of the Earth.
Figure 2D:
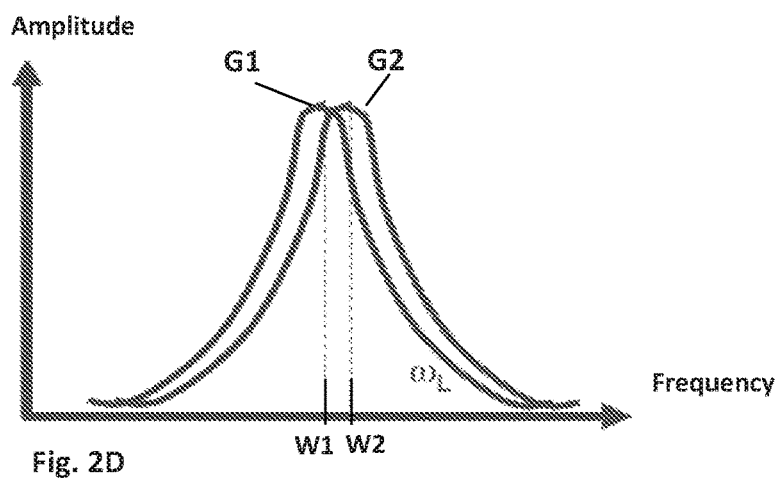
FIG. 2D is a graphical illustration of heading errors which may be introduced as a dominant part in cumulative noise to magnetic field gradient measurements that are obtained by two different atomic sensors having somewhat different respective orientations (e.g. heading orientations) with respect to the magnetic field.
Figure 2E:
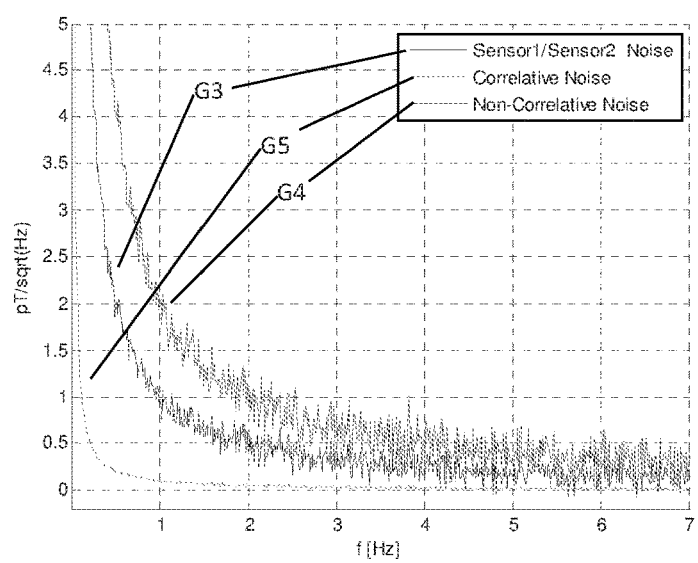
FIG. 2E is a self explanatory graphical illustration of cumulative errors/noise which may be introduced to measurements of the magnetic field gradient when utilizing two or more different atomic sensors due to various internal noise that might in general resulted from somewhat different filling substances in the vapor cells of the sensors and/or somewhat different orientations (heading errors) of the sensors with respect to the magnetic field.
Figure 2F:
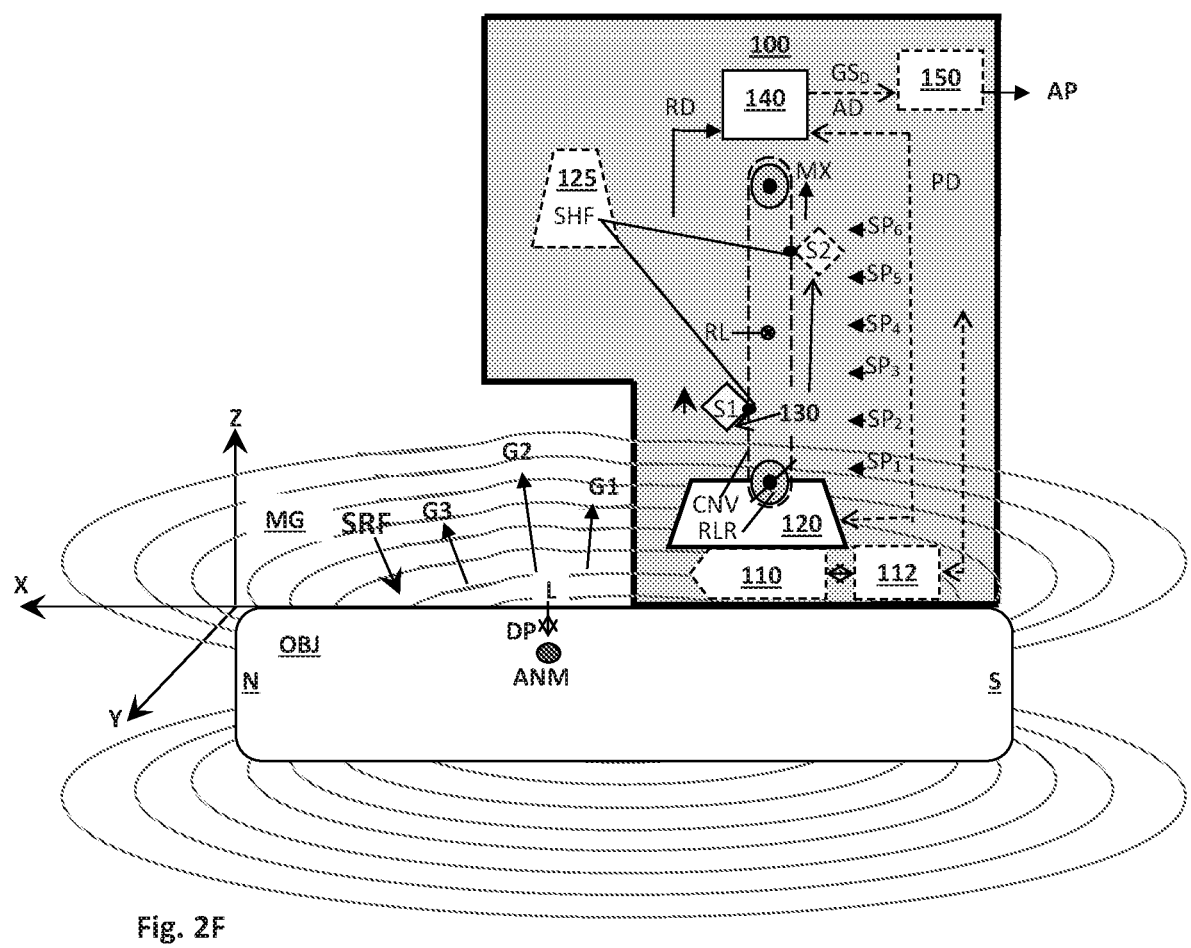
FIG. 2F is a block diagram schematically illustrating a gradiometer system according to an embodiment of the present invention in which the displacement vector between the sensing positions is varied by moving the sensors.
Figure 2G:
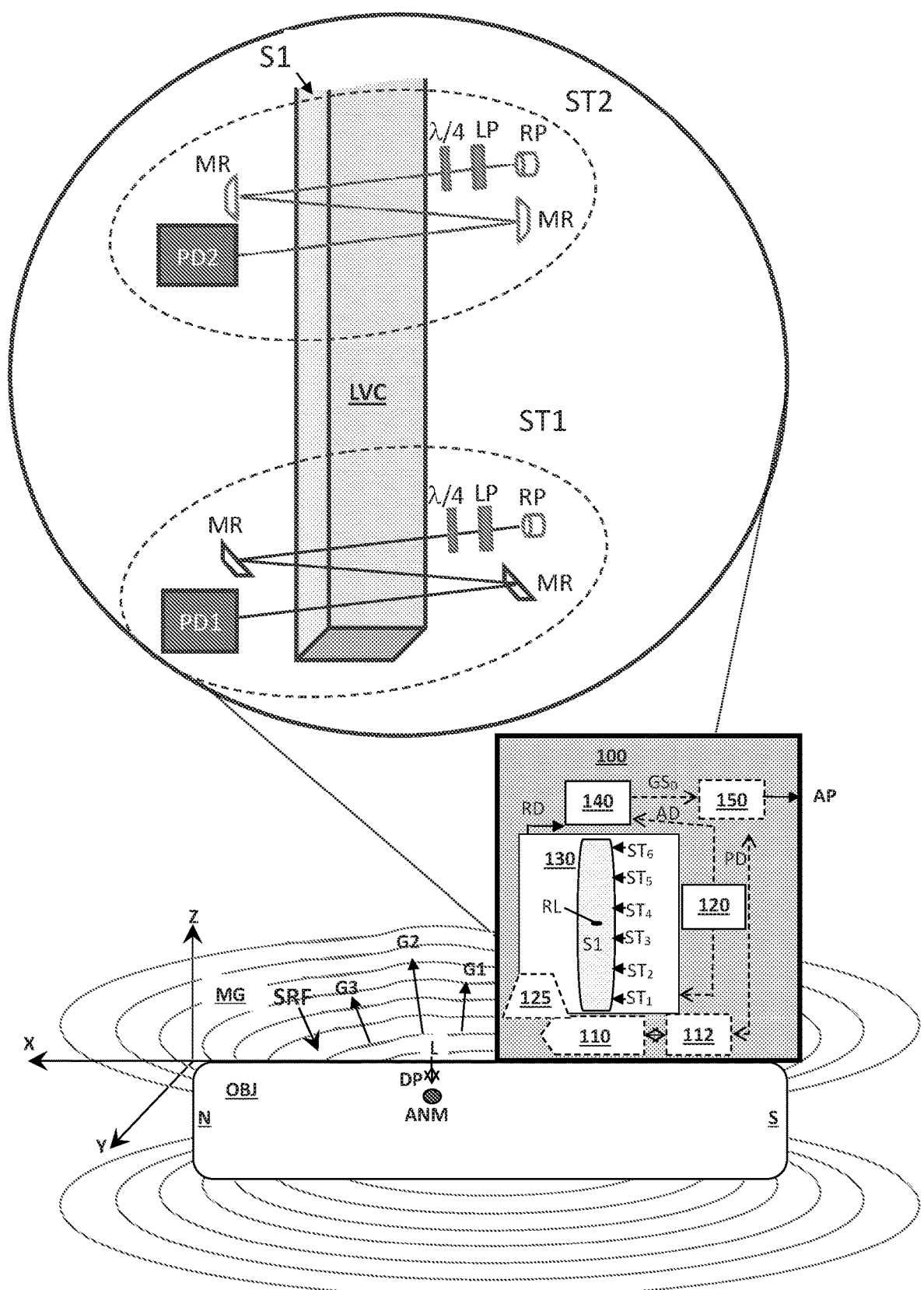
FIG. 2G is a block diagram schematically illustrating a gradiometer system/s according to an embodiment of the present invention in which a multipoint atomic sensor with a plurality of magnetic field sensing sites coupled a common large vapor cell is used for varying the displacement vector between the magnetic field sensing positions.

Reference is made to FIG. 2A to 2G which together illustrate the principles of the invention. FIGS. 2A, 2F and 2G are block diagrams schematically illustrating a gradiometer system 100 according to three embodiments of the present invention; FIG. 2B illustrates active zones (i.e. active sensing angular zones) and dead zones (i.e. dead sensing angular zones) of a scalar magnetic sensor S used in the gradiometer system of the invention according to some embodiments of the present invention; FIG. 2C illustrates L-shells of the magnetic field of the Earth; and FIGS. 2D and 2E graphically illustrates cumulative error/noise to the gradiometry signal resulting from use of two or more different atomic sensors, due to different orientation with respect to the magnetic field and/or cumulative noise caused by variation in the composition of filling substances in the vapor cells of the different sensors.

FIG. 2A is a block diagram of a gradiometer system 100 of the present invention for detecting anomalies/irregularities ANM located/buried beneath a surface of an object OBJ having a magnetic field MG, such as the Earth. The magnetic irregularities ANM may be for example magnetic-anomalies/objects/regions having magnetic permeability different than the general permeability of the scanned object and/or they may be objects/regions associated with a magnetic dipole.

The gradiometer 100 includes one or more scalar magnetic sensors 130, e.g. including sensor S1 and optionally also sensor S2 and/or additional sensors, that are adapted to sense the magnitude of the magnetic field in their vicinities and an actuation module 120 that is connectable to at least one of the scalar magnetic sensors (the actuation module in the figure is connected to sensor S1 and also to the optional additional sensor(s) S2). The actuation module 120 is configured and operable to repeatedly vary the sensing position(s) at which the sensor(s) connected thereto sense the magnetic field according to a certain displacement function.

In some embodiments one more scalar magnetic sensors are actuated (and operated) simultaneously and continuously by actuation module 120, while the sampling is taken from different sensing positions (from the continuous output data stream) according to predefined displacement function.

For example displacement function may be associated with linear motion of the sensing positions along a vertical axis Z, such that the sensing position alternates (e.g. swings/oscillates) with respect to a certain reference location RL about which the gradient of the magnetic field MG is to be measured.

The gradiometer 100 also includes a controller 140 that is adapted to obtain readout information (data/signals) RD from the sensor/s 130. The readout data RD is indicative of the magnetic field sensed by the sensors 130 while the sensing position of at least one of the sensors 130 is moved/varied by the actuation module 120. The controller 140 is also adapted to obtain displacement information (data/signals) AD indicative of the displacement function, by which the sensing positions of the sensor(s) 130 are moved/varied as a function of time. In some embodiments the sensors are actuated simultaneously and continuously, and the varied readout from different sensing places is obtained/sampled from the readout data according to a predefined displacement function. The displacement information AD may be for example predetermined data indicative of a certain (e.g. known/predetermined) displacement function which may be for instance stored in a memory of the controller, or it may be data obtained from the actuation module 120, which changes the sensing positions from which the readout data is obtained.

The controller 140 is configured and operable to process the read out information RD based on the displacement information AD to obtain data/signal indicative of a gradient of the magnetic field sensed by the one or more sensors 120 with reduced noise.

Figure 1A:
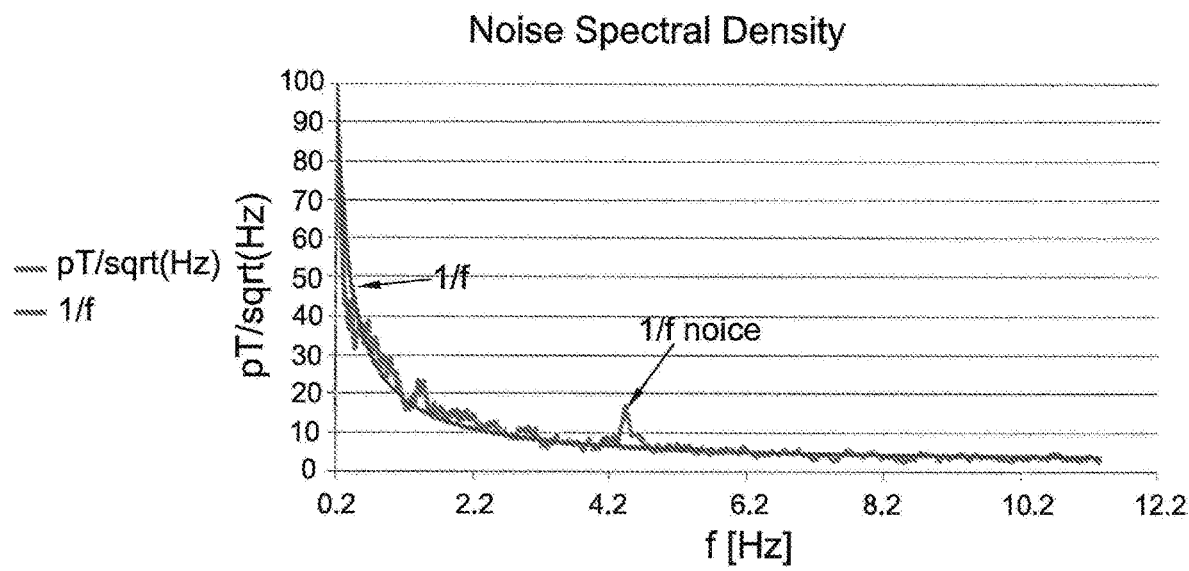
FIG. 1A is a graphical illustration of the noise of a magnetic field sensor as a function of the measurement frequency.

To this end, the technique of the invention enables to measure the gradient of a magnetic field MG, or of one or more vector components thereof, with improved sensitivity and thus with improved accuracy. As is generally known in the art, the readout information RD, being output from the conventional magnetic sensors, includes a signal component S (which is the component of the readout that actually relates to the properties of the magnetic field MG sensed by the sensor), and a noise component N (e.g. internal noise), RD~S+N. A prominent noise component of such sensors, specifically when the sensors are scalar atomic operated with low measurement frequency (e.g., <10 Hz), is generally known as and referred to herein as 1/f noise. As generally known, 1/f noise relates to noise N, whose spectral density is proportional to the inverse frequency raised to a power α, where α can be in the range ½<α2. FIG. 1A shows a graph illustrating schematically in self explanatory manner the relation between the power spectrum of 1/f noise obtained from a scalar magnetic atomic sensor and the measurement frequency f. As a reference, the graph of the function 1/f is also depicted in the figure. The inverse Fourier transform of such a noise, which indicates its magnitude, is proportional to $T^{\alpha-1}$, where T is an intrinsic/characteristic time of the measurement system and the measured quantity. It should be understood that here T is not the measurement duration, but rather the characteristic time of the measurement (e.g., the time scale of change in the signal (magnetic field) that is being read/sensed). Therefore, according to certain embodiments of the invention, the repeated variation of the sensing position(s) of the sensor(s) 130 which results in modulation (e.g. with frequency f) of the signal of the magnetic field MG which is being read/sensed, shifts the spectral density curve of the measured signal towards higher frequency (or, in other words, shortens the characteristic time T of the measurement) and thus reduces the noise level (e.g., due to reduction in the 1/f noise).

In this case the level of 1/f noise may become substantially invariant to the measurement duration t and/or to the speed of the platform carrying the sensors and/or to the time spent (required) for scanning the magnetic field MG over a given area, since a more rapid change in the sensed magnetic field may be introduced by the change of the sensing positions of the sensors. This allows carrying the magnetic field measurements over longer durations (for example for detection of slowly varied magnetic anomalies) without reducing the frequency f of the measurement (i.e. without increasing the characteristic time T) and thus without impeding the SNR of the measured signal (RD).

It is noted that the quality of measurements (e.g., resolution) is better when the measurement, for scanning the magnetic field of a given region/area, is performed for longer durations (e.g. using a vehicle/platform moving at slow velocity). In view of the above, the invention allows prolonging the measurement duration of each section/area which is to be mapped with no substantial increase in the 1/f noise. Accordingly, the SNR may be improved, since more measurement samples/readings can be acquired when measuring over longer durations, and because the noise can be considered as a quantity that is randomly distributed in time (in which case the SNR is in general proportional to $\sqrt{n}$, where n is the number of measurement samples/readings).

Further reduction in the noise level may be obtained by processing the readings of magnetic field measurements taken from two different sensing positions to obtain gradiometer measurements/signal indicative of the gradient of the magnetic field (e.g. by subtracting the magnetic field measurements/signal obtained from the different sensing positions). Obtaining the gradiometer measurements may be performed by processing the magnetic field measurements accrued from different sensing positions substantially at the same time. This may be achieved by utilizing two atomic sensors located at the different positions and mounted for movements (as exemplified in FIG. 2F), and/or by utilizing a single large multipoint atomic sensor to simultaneously sense the magnetic field at the different positions while moving these sensing positions in time (as exemplified in FIG. 2G). In this case, the accuracy of the measured gradient of the magnetic field MG is less susceptible to timely variations in the magnetic field, since the magnetic field measurements at the different sensing locations are performed at the same time. Also, in embodiments where a single large multi-point magnetic field sensor is used to obtain the magnetic field measurements at the different sensing locations, further reduction in the noise of the measured magnetic field gradient may be obtained since the noise of the magnetic field readings from two measurements being subtracted are generally correlated (due to the fact that the magnetic field measurements at the different locations are performed utilizing the single vapor cell and are thus associated with the same volume and composition material composition). For two noise figures that are 100% correlated, the noise will be nullified. When utilizing two different sensors (two different vapor cells), the noise might be not be correlated or only partially correlated in case the two different sensors are similar.

Alternatively the gradient measurement may be obtained by utilizing a single atomic sensor that is mounted for movement to the different sensing positions (as exemplified in certain implementations of FIGS. 2F and 3C) and subtracting the readings of measurements taken by one sensor at different times while correspondingly it is at the different sensing positions/locations. In this case, since the single sensor is used, the noise will be substantially correlated, thus further contributing to the reduction of the noise level in the magnetic field gradient measurements/signal. However, since the measurements at the different locations are acquired at different times, the accuracy of the gradient measurements might be susceptible in this case to rapid changes in the intensity of the measured magnetic field, which occur/change within a time scale shorter than the time interval between the measurements thereof at the different locations.

According to some embodiments of the present invention, presented here as an example without loss of generality, are typical spatial magnetic field gradiometry mappings (magnetic field gradient measurements) for detection of an anomaly ANM, whose vertical distance from the magnetic field sensors is about 10 meters (e.g. an anomaly located/buried 10 meters beneath the ground surface), which requires mapping the magnetic field gradient above for over a distance within the range of about 10 to 50 meters, and more preferably over a distance of about 20 to 50 meters and should therefore require measurement time t of about t=1 to 2 seconds in case the platform (e.g. terrestrial vehicle) carrying the magnetic sensors is moving at a velocity of 10-20 m/sec. Thus, in the absence of any movement of the sensing positions of the sensors (e.g. relative to the platform 110 carrying them and/or relative to one another), the characteristic time T of the measurement (being the time required to obtain significant change in the measured magnetic field gradient) actually equals to the required measurement time t about 1 to 2 seconds, and, accordingly, the measurement frequency is in the order of ½ to 1 Hz, which gives rise to a significant level of 1/f noise in the measured signal.

Therefore, according to the invention, the sensing positions, at which the magnetic field MG is sensed, are moved (e.g. in a harmonic/oscillation motion and/or other repeated/periodic motion) one relative to the other and/or relative to the platform 110 carrying the magnetic sensor(s). The movement of the sensing positions is used to reduce the characteristic time T of the measurement to the period/characteristic time scale of the movement of the sensing positions. For instance, the positions at which sensing is performed for the purpose of calculating the gradient of the magnetic field MG be moved in a repeated/periodic motion with time period in the order of 0.5 seconds or less (i.e., periodic movement with frequency of 2 Hz or higher). The relative movement of the sensing positions (relative to one another) introduces significant changes (e.g. hereinafter also referred to without loss of generality as modulation) to the gradient signal calculated/processed from the magnetic field measurements taken at these positions, and thus the characteristic time scale of the measurement T becomes (is reduced to) the time scale of the movement of the sensing positions. Accordingly, the level of the 1/f noise component in the measured signal is reduced. It should be emphasized, that total measurement duration t may be kept relatively long (e.g., in the order of several seconds), thus allowing to acquire many measurement readings/samples and obtain accurate and reliable measurement results. The combination of both of these features contributes the improvement of the measurement's SNR, due to the 1/f noise component reduction (reduction of the characteristic time T), and yet allows measurements of longer durations to be carried out. This improves the resolution and SNR, which benefits from enlargement of the samples number n.

The present invention provides a technique for accurately extracting information on the gradient of the magnetic field MG from the readout data of one or more magnetic sensors while diminishing the noise component N from the gradient information, or entirely eliminating it.

As indicated above, the invention provides a novel technique for performing magnetic field survey in the background of Earth' magnetic field (e.g., in the order of 40 micro-Tesla), for example it may be utilized in the vicinity of the ground-surface level. Survey results are provided with improved accuracy and sensitivity facilitating detection of minute changes in the magnetic field e.g. in the order of 0.5 nano-Tesla. This requires measuring the gradient of the magnetic field of the Earth with SNR in order of ~60 dB or better, while also providing a robust system that can operate reliably (outdoors) while being mounted on a carrier platform 120, such as a terrestrial vehicle, and exposed to temperature changes and mechanical vibrations. It is noted that the platform 120, as well as other element/modules thereon is/are preferably made/include non-magnetic materials (namely made from materials having no, or negligible, magnetic reply; e.g. materials such as aluminum, titanium or plastic, ceramic material), so that the magnetic field measurement of the sensors is not/is negligibly affected by the materials of the platform 120 carrying the magnetic sensors.

Various types of existing magnetic sensors have been considered, in order to achieve the goal of measuring the gradient of the magnetic field of the Earth with high SNR (e.g., in the order of −60 dB or better). Vector magnetometers were found to be unsuitable for this purpose as they are subject to temperature drift and to dimensional and alignment instabilities which affect their reliability when operating outdoors. Therefore, in certain embodiments of the present invention, the sensors module 130 includes scalar magnetometer sensor(s) (e.g. S1 and optionally S2). In order to allow both detection and location of the magnetic anomalies/irregularities ANM, the scalar sensor(s) 130 are arranged/mounted in the system 100 to measure the magnetic field MG at different positions (e.g. above and below the reference location RL) such that a measure of the gradient of the magnetic field MG along a certain axis can be obtained from the data/signals RD readout from the sensors 130.

According to the present invention measurement of the gradient of the magnetic field MG with sufficient accuracy (e.g., SNR in the order of 60 dB or better), is achieved by movement/variation (e.g. harmonic/periodic movement such as swinging/rocking/oscillating) of the sensing positions at which the magnetic field is sensed by the sensor(s) 130 relative to the reference location RL (i.e., about which the magnetic field gradient should be sensed/measured). As described above and further described in more detail below, the movement/variation in the sensing positions may be achieved by either mechanically moving of the sensor(s) 130 and/or by utilizing a large multipoint vapor cell sensor that enables performing magnetic field measurements at different locations thereof and operating such sensors to vary the locations from which magnetic field measurements are obtained. The readout data RD obtained from the sensor(s) 130 at different positions thereof is then used to calculate the gradient/s of the magnetic field with respect to reference location(s) RL about which the sensing positions were/are moved/varied. For instance, in case the sensing position(s) move back and forth (e.g. swing/rock/oscillate) with respect to the reference location(s) RL, the gradient of the magnetic field signal S sensed by the sensor(s) 130 also modulates/oscillates in accordance with this movement. The noise N (e.g. particularly internal 1/f noise of the sensor(s) 130) is generally not affected by the movement of the sensing positions and/or of the sensor(s) 130 and therefore does not modulate. Accordingly, by knowing the form of the modulation of the signal S (e.g. the form can be determined/assessed based on the characterizing frequency component(s), such as the prominent Fourier components, composing the predetermined displacement function according to which the sensing positions of the sensor(s) 130 are moved/varied (relative to the platform), the signal S may be accurately extracted from the readout data, while filtering out the noise N, or at least a large portion thereof. The technique of the invention for extracting the accurate gradient signal S from the data RD readout from the moving sensing positions 130 is described in more detail below with reference to FIG. 3A which is a flow chart 200 of a method carried out by the system 100 (particularly the controller 140) to process the data/signals RD from the sensors 130.

It should be noted that for the purposes of magnetic survey of the magnetic field MG of the Earth (considering various parameters of the Earth's magnetic field (such as its magnitude and its nominal gradient), and required sensitivity of the survey, scalar atomic magnetic sensors (particularly optically pumped vapor cell magnetometers) were found by the inventor to be most suitable. Yet, such atomic magnetic sensors are still not sensitive enough, by themselves, to enable detection of objects/anomalies having small effect, i.e., in the order of nano-Tesla (nT), on the sensed magnetic field gradient (e.g. for detection of objects/irregularities/anomalies of relatively small magnetic reply/s such as UXO). This is particularly true because the sensor's noise has 1/f characteristic behavior and the bandwidth of the measurement is low (close to DC). For example, a typical sensitivity of an optically pumped Cesium Vapor cell type magnetometer sensors may be 0.005 $nT*Hz^{-1/2}$ thus giving an accuracy of only 0.05 nT when the typical bandwidth of the measurement system goes down to 0.01 Hz. Therefore, according to the invention, in order to achieve the desired accuracy for the bandwidth of the system, the sensing positions are varied/moved (e.g. relative to one another and/or relative to a reference location RL or the platform 110) so as to allow filtering out their 1/f internal noise. This allows achieving accuracy levels better than nT, for example in the order of 1 Pico-Tesla (pT) or less.

It should be noted that another source of noise/error (apart from the 1/f noise indicated above) from scalar atomic sensors (particularly when using several such sensors for measuring the gradient of the magnetic field), may arise due to the fact that the sensitivity of such scalar atomic sensors may be not entirely isotropic. This error/noise, often referred to as heading error, may affect the accuracy of the measurement due to changes in the relative orientation between the sensor/s 130 and the direction of the vector of the magnetic field MG measured thereby. More specifically, some heading error will always exist in each particular sensor due to its various orientations with respect to the magnetic field. This means that magnetometer performance is somehow limited by its specific structural design, which takes an effect as shifts dependent on the magnetic field orientation. This is also means that different sensors inherently possess different heading errors, which together form part of a cumulative error/noise that is included in the measured gradiometry signal calculated from different sensors, thus introducing a greater overall sensitivity threshold, limiting the system performance.

In addition, scalar atomic sensors often have angular zones (referred to herein after interchangeably as active zones and as active sensing angular zones), within which the magnetic field (as well as the magnetic reply from anomalies/objects near the sensors) is sensed with good/optimal sensitivity, as well as other angular zones (referred to here and after interchangeably as dead zones and as dead sensing angular zones) within which the magnetic field (and the magnetic reply) is sensed with reduced/lower sensitivity or substantially not sensed. For instance FIG. 2B depicts schematically a cross-sectional view taken of a scalar atomic sensor S (illustrated by a rhombus in the figure) such as an optically pumped atomic vapor cell sensor, along with corresponding active AZ and dead DZ zones of the sensor S. The dead zones of the scalar atomic sensors typically comprise polar dead zones $DZ_P$, which are in the form of cones extending from the poles of the sensor, and toroidal/equatorial dead zone $DZ_E$, which is in the form of a torus encircling the equator of the sensor. The polar axis PX of the sensor S and an axis EX lying in the equatorial plane of the sensor S, are illustrated in the figure. As presented in the figure, the sensitivity of the sensor is non isotropic; dead zones DZ of negligible, or of reduced sensitivity, spread into an angular zone $DZ_P$ (polar dead zones) having a conic form of angle $\Omega_P$ about the poles of the sensors (about the polar axis PX) and also at toroidal region $DZ_E$ (toroidal/equatorial dead zone) enclosing the sensor about its equatorial plane and having a conic angle $\Omega_E$. The cone angles $\Omega_P$ and $\Omega_E$ may or may not be of the same angular extent and may be, for example, in the order of 10° depending on the specific type of the sensor S. At angles outside the dead zones DZ the active zones AZ of the sensors spread. To this end, for sensing and monitoring the magnitude of the magnetic field MG of an object (e.g. of the Earth) with good accuracy, the sensor should be preferably oriented in such a way that the direction of the vector of magnetic field MG lies within the active zones AZ (as illustrated for example in the figure). Considering the example in the figure, the active zones AZ are the angular toroidal zones for which the angle $\varphi$ of the magnetic field vector MG satisfies: $\Omega_P < \varphi < (90°-\Omega_E)$ or $(90°+\Omega_E) < \varphi < (180°-\Omega_P)$, and the dead zones are the zones satisfying: $0 < \varphi < \Omega_P$ or $(90°-\Omega_E) < \varphi < (90°+\Omega_E)$ or $(180°-\Omega_P) < \varphi < 180°$.

To summarize, the dead zones of the scalar atomic sensors typically comprise polar dead zones $DZ_P$, which are in the form of cones extending from the poles of the sensor, and toroidal dead zone $DZ_E$, which is in the form of a torus encircling the equator of the sensor.

In some embodiments of the present invention the gradiometer system is configured and operable for performing a magnetic survey by scanning at least a part of the surface of the object/Earth OBJ to thereby map the magnetic field gradient in that part of the surface. The scanning is performed by utilizing the platform 110 to move the gradiometer system 100 along a scanning plane for scanning the part of the surface (typically the scanning plane is parallel to one of the scanned surfaces of the object/Earth OBJ). Scanning is performed by driving the platform 110 along one or two dimensions in the scanning plane while maintaining/ensuring that the sensed magnetic field is oriented in the active zones AZ of the sensors.

According to certain embodiments of the present invention, maintaining the magnetic field to be oriented within the active zones AZ of the sensors during the scan is achieved by at least one of the following ways depending on whether or not the direction of the magnetic field lines MG is substantially perpendicular/parallel to the scanning plane.

In the latter case (when the direction of the magnetic field lines MG is neither perpendicular, nor parallel to, the scanning plane) the magnetic field may be oriented to be within the active zones AZ of the sensors by selecting/adjusting the sensor(s)' mounting orientation (e.g., to the platform) with respect to the scanning plane (e.g., about which the platform 110 is driven to map the magnetic field of the object OBJ), such that the toroidal dead zone $DZ_E$ of the sensors lies substantially parallel to the desired scanning plane.

In other words, in some embodiments, the sensors may be mounted such that their orientation is maintained substantially vertical with respect to the platform while the platform can be driven to perform the scanning/mapping in the horizontal directions. When the sensors are laid/oriented vertically, their sensitivity is isotropic with respect to the horizontal plane, and therefore the gradiometer platform 110 can be moved and directed to perform the scan in any direction within the horizontal plane without affecting sensitivity of the magnetic field sensing. Indeed, this is true only as long as the direction of the magnetic field MG is not horizontal and is not vertical (namely it is not directed in the polar dead zones $DZ_P$ of the sensor(s) 130 and not directed in the equatorial dead zones $DZ_E$ of the sensor(s) 130 but is within the active regions of the sensors.

Figure 1B:
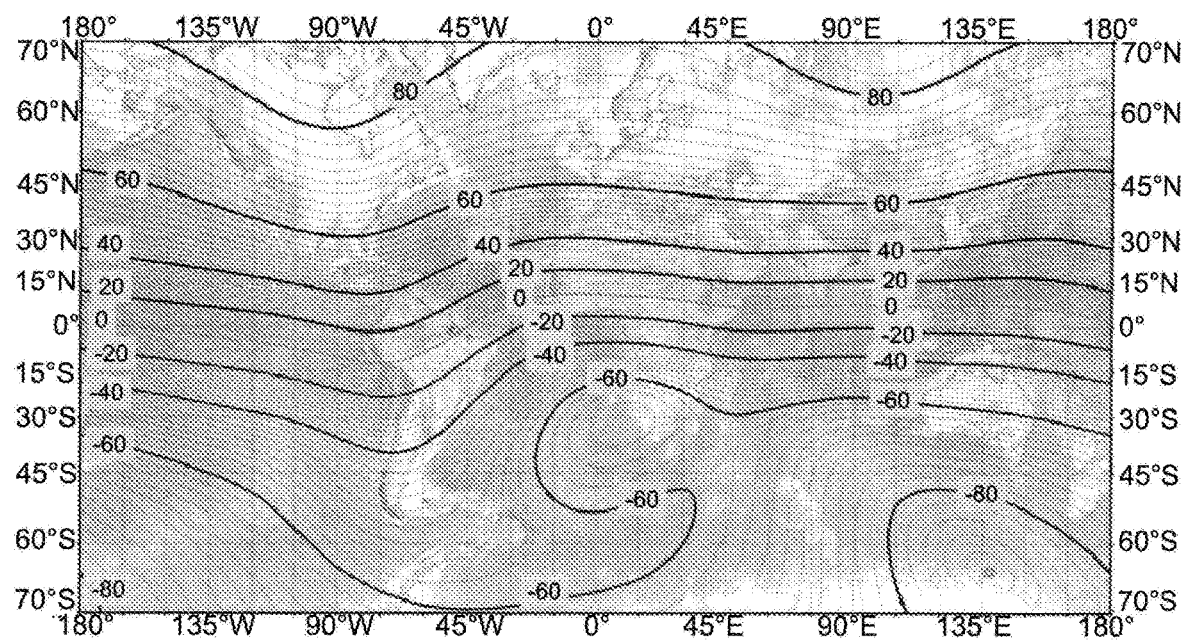
FIG. 1B is a schematic illustration of the magnetic field of the Earth.

Yet it should be noted that in the vicinity of ground altitude/level, the magnetic field of the Earth is neither vertical nor horizontal in most regions of the Earth (except for near the magnetic poles of the Earth at which the magnetic field is about vertical, and near the magnetic equator of the Earth at which it is about horizontal). This is schematically illustrated in a self explanatory manner in FIG. 1B, which shows the orientation (angle), at different locations on the Earth, of the Earth's magnetic field with respect to the horizon, and in FIG. 2C which shows several L-shells of the magnetic field of the Earth. More specifically, the figure shows L-shells 1.5, 2, 3, 4, and 5 which are the planetary magnetic field lines that cross the Earth's magnetic equator at respective heights of 1.5, 2, 3, 4 and 5 times the Earth-radius. Practically, except for the magnetic poles and the magnetic equator, at near ground level the absolute the angle $\varphi$ of the Earth's magnetic field lines with respect to the vertical direction (i.e. the Earth's radial/direction of the gravity) is roughly between 35° and 55°. In other words, considering the aforesaid, it should also be considered that the active zones of the sensors are $\Psi_P < \varphi < (90°-\Omega_E)$ or $(90°+\Omega_E) < \varphi < (180°-\Omega_P)$ and that the cone angles $\Omega_E$ and $\Omega_P$ are in the order of about 10° for practical atomic sensors.

Therefore according to some embodiments of the present invention the magnetic sensors 130 are mounted/furnished on the platform 110 such that their nominal orientation is vertical to the scanning plane (namely vertical to the ground). For most/many regions of the Earth, this orientation setting of the sensors 130 satisfies the above condition that the magnetic field lines of the Earth pass in the active zones of the sensors. Indeed, the active zones of the sensors 130 have rotational symmetry with respect to the polar axis PX (e.g. they are toroidial or cone-like), and therefore, when the sensor 130 is mounted substantially vertically (i.e. the polar axis PX thereof being aligned along the vertical direction), the sensitivity of the sensor 130 to the terrestrial magnetic field will not change when rotating the sensor about the vertical axis (namely, in this case, about its polar axis PX). In this position, the angle between the direction of the magnetic field MG and the polar axis PX of the sensor 130 will remain such that the direction of the magnetic field is within the active zones of the sensors.

However, even within the angular extent $\Omega_P < \varphi < (90° - \Omega_E)$ or $(90° + \Omega_E) < \varphi < (180° - \Omega_P)$ of the active zone AZ, the sensitivity of the atomic magnetic sensors is typically not isotropical, and slightly changes when the direction of the magnetic field MG changes relative to the orientation of the sensors 130. This may be a source for so called heading errors in the magnetic field measured by the sensors 130. Thus, when the sensors 130 are mounted on platform 110 being a terrestrial vehicle (which may be driven on rough terrain), heading errors of the sensors may significantly impair the accuracy of the magnetic field measurements (e.g. due to vibrations and rocking of the vehicle movement). Indeed, when magnetic field gradient measurements are performed by using a single large multipoint sensor S1 for simultaneously sensing the magnetic field at different locations (as for example in the embodiment of FIG. 2G, the orientation of the sensing points is similar, and therefore the heading errors which are generally similar in the magnetic field measured at the different locations (since it is measured by the same sensor with the same orientation relative to the magnetic field) may therefore practically be cancelled out when calculating the magnetic field gradient signal (subtracting one magnetic field measurement from the other). However, heading errors may introduce significant cumulative errors to the measured gradient of the magnetic field, in cases where several sensors are used to measure the magnetic field at different locations, and/or in cases where the magnetic field at the different locations is measured at slightly different times (e.g. by the same sensor). This is because in such cases locations the magnetic field MG at the different locations may be measured while the sensor(s) may be at a slightly different orientations relative to it, and therefore the heading error from the magnetic field measurements at the different locations are in this case not similar (not correlated with one another) and generally add up when computing the magnetic field gradient. This may give rise to commutative heading errors in the measured magnetic field gradient.

Therefore, according to some embodiments of the present invention, the sensor(s) 130 are mounted to the platform 110 via an orientation stabilization mechanism 125. The orientation stabilization mechanism 125 may for example include an adjustable pivotal mechanism SHF, such as a shaft or a gimbal arranged to interconnect between the platform 110 and the sensors 130 and may possibly include an orientation measurement system (for example being a part of the scanning/driving controller 112 described below) configured and operable for measuring the orientation of the sensors/platform and operating the adjustable pivotal mechanism SHF maintains the sensors 130 at substantially fixed orientation relative to a reference frame external to the platform/terrestrial vehicle 110. This provides for adjusting the sensors' orientations with respect to the horizontal/sensing plane, thus reducing the heading errors of the magnetic field measurements of the sensors and thus suppressing the cumulative heading errors in the measured magnetic field gradient.

According to some embodiments of the present invention the system 100 also includes a scanning/driving controller 112 that is configured and operable to control the driving/scanning path of the platform 100 along which it maps the gradient of the magnetic field MG. The scanning/driving controller 112 may include for example positioning systems such as GPS or other inertial positioning systems (such as accelerometers) providing path data PD indicative of the position and movement path of the platform 120 as its moves to scan the gradient of the magnetic field.

In some embodiments in which an orientation stabilization mechanism 125 is used to interconnect between the sensors 130 and the platform 110, the scanning/driving controller 112 may also include an orientation measurement system (such as a magnetic-compass/gyros/accelerometers). The orientation measurement system is configured and operable for measuring the orientation of the platform 110 and operating the orientation stabilization mechanism 125 to adjust the orientation of the sensor(s) to compensate over the changes in the horizontal orientation on the platform 110 and/or over changes in the vertical orientation of the platform 110. This provides for maintaining the direction of the magnetic field MG within the active regions AZ of the sensors 130, regardless of the direction to which the platform faces, and/or for reducing heading errors from the magnetic field measurements by the sensors 130. It should be noted that compensation over the horizontal changes in the platform orientation (direction of driving) may not be required in cases where the sensors are 130 mounted substantially vertical to the scanning plane (here the phrase substantially includes any vertical orientation for which the scanning plane is within the angular extent $\Omega_E$ of the equatorial dead zone $DZ_E$). Also compensation over changes in the vertical orientation of the platform 110 may be less needed in cases where a single sensor S1 is used for simultaneously measuring the magnetic field MG at two sensing positions (e.g. as in FIG. 2G), because in this case (as long as the direction of the magnetic field MG remains within the active regions AZ of the sensor) the heading errors from the two sensing positions are correlated and are therefore canceled out when computing the gradient of the magnetic field. To this end in case of a single large multipoint sensor S1 (e.g. as in the embodiment of FIG. 2G) there may be no need for the orientation stabilization mechanism 125.

Reference is now made to FIG. 2F which is a block diagram of a gradiometer system 100 according to an embodiment of the present invention in which the sensing positions of the sensors 130 are moved according to the predetermined displacement function, by moving the sensors 130 themselves, namely by moving the sensor S1 and optionally also moving the sensor S2. To this end in this example the actuation module 120 is configured as a mechanical module which is mechanically connectable (e.g. carries) the one or more sensors and is adapted to vary their sensing positions by moving the sensors along a predetermined path such that the sensor(s)' respective positions follow a predetermined displacement function.

Other modules of the gradiometer system 100 may have similar functionalities and/or may be configured similarly to corresponding modules described above with reference to FIG. 2A which are indicated with similar reference numerals.

The gradiometer measurements, which are obtained by processing the signals from the sensor(s) while they are at different locations along the predetermined path, are therefore modulated according to the predetermined displacement function. Accordingly the 1/f noise (which is not modulated) can be reduced from the gradiometer signal, for example most or all of the 1/f noise may be reduced during demodulation of the modulated gradiometer signal.

In this embodiment the actuation module 120 may include a motor (e.g. electric) or any other suitable actuation unit which may be connected to one or more of the sensors 130 (for example via suitable mechanical/transmission assembly such as a conveyor system) for actuating and moving the one or more sensors according to the desired displacement function with respect to the reference location RL.

In this case, since the sensors 130 are actuated for movement relative to the platform 110, there is a need to maintain/adjust the sensors' 130 orientation during their actuation by the actuation module 120, in order to keep the magnetic field directed in the active zones AZ of the sensors, and/or to avoid/reduce heading errors resulting from changes in the relative orientation between the sensors themselves (in case of more than one sensor) and/or the orientation of the sensors and the inertial reference frame (external to the platform 110) which is achieved, as described above, by suitable pivotal mechanisms (SHF) and/or using suitable transmission assemblies.

Therefore, optionally in this embodiment of the present invention, in order to provide the desired magnetic field gradient measurement accuracy, one or more of the sensors 130 are mounted on (i.e., are mechanically coupled to) the actuation module 120 via respective orientation stabilization mechanisms 125 which adjust the sensors' orientations during their motion by the actuation module 120 in accordance with a known/predetermined displacement function. The orientation stabilization mechanisms 125 maintain the orientation of the sensor(s) 130 such that the direction of the magnetic field MG to be sensed remains within the active zone(s) AZ of the sensor(s) 130. Optionally each of the sensors 130 (e.g. sensor S1 and optionally also sensor S2) are mechanically coupled to the actuation module 120 via orientation stabilization mechanisms 125. In this example the orientation stabilization mechanisms 125 may for example include pivots, gimbals and/or transmission assemblies coupling the respective sensors to their designated locations on the actuation module 120.

As described above the orientation stabilization mechanisms 125 maintain orientation of the sensor(s) 130 such that the direction of the magnetic field MG to be sensed remains within the active zone(s) AZ of the sensor(s) 130, thereby enabling reliable and continuous measurements of the gradient of the magnetic field by the sensors 130. Preferably according to some embodiments of the present invention the orientation stabilization mechanisms 125 are also configured and operable to maintain the sensors 130 at substantially fixed orientations relative to the inertial reference frame external to the platform, e.g. such that their orientations do not deviate by more than 1% relative to one another (e.g. relative to the vertical axis). This provides for substantially reducing the heading errors of the sensors, even in cases where the platform (e.g. terrestrial vehicle) 110 is driven on sharp slops/tilted surfaces, thus enabling accurate measurement and mapping of the gradient of the magnetic field.

According to certain embodiments of the present invention the sensors 130 are mounted for linear motion along an axis of measurement MX which is generally in the direction of the vector component of the gradient measured by the system 100. For example in some implementations of the invention the actuation module 120 includes a conveyor system including rollers RLR and conveyor belt/chain CNV on which the sensors 130 are mounted. The sensors 130 are actuated by the conveyor to move linearly back and forth past the reference location RL along the measurement axis MX. As indicated above, the sensors are mounted onto the actuation module 120 such that their orientation is maintained substantially constant (e.g. within a certain predetermined threshold) while they are moved back and forth about the reference location RL. For instance, in certain embodiments of the system 100 the sensors S1 and optionally S2 are mounted to the conveyor CNV via orientation stabilization mechanisms 125 being in the form of pivotal mechanisms (e.g. shafts/axles/hinges) SHF which allow their orientation to be adjusted/maintained within a desired threshold such that the magnetic field MG is directed in the active zone of the sensors. For example, in some embodiments the desired orientation of the sensors is maintained by the gravity force in cases where the sensors are appropriately hung from their respective pivotal mechanisms SHF. Alternatively or additionally, the orientation stabilization mechanisms 125 of the sensor(s) 130 may include predesigned transmission assemblies (not specifically shown) connectable between the respective sensors S1 and optionally S2 and the actuation module 120 and configured and operable to adjust the orientation of the sensors 130 during their movement. For instance in the present example, where a conveyor system is used, the transmission assemblies may be connectable to the conveyor system and operable to adjust the orientation of the sensors based on the state of the conveyor system (the position of the conveyor belt).

As indicated above, the controller 140 obtains/reads the readout information RD (data/signals) from the sensor(s) 130 while they are moving. Indeed, various techniques may be implemented in the system 100 in this embodiment, where the sensors 130 are in motion, for providing the readout information RD (data/signals) from the moving sensors 130 to the controller 140, for example by utilizing wireless transmission of the information, and/or utilizing electrical connection modules dedicated for electrical connection between moving elements (such as slip-rings and brushes). However, use of such techniques as described above for providing data/signal connection between the sensors 130 and the controller 140 may in some cases significantly impair measurement accuracy, because transmission of the readout information RD in this way may introduce noise to the magnetometer/sensor measurement. Thus in certain embodiments of the present invention the feature that the orientation of the magnetic sensors is maintained during their motion is further exploited to electrically connect the sensors to the controller by continuous wired connection (namely by continuous non-moving wires/electric conductors and without moving parts such as slip rings and brushes). This provides improved measurement accuracy as compared to other techniques for providing the readout data RD to the controller 140. To this end it should be noted that in case the actuation module 120 is configured and operable to provide rotary motion to the sensors (e.g. in cases where the conveyor continuously rotates in one direction), such continuous wired connection facilitates mounting of up to two sensors on the actuation module where the connection cables/wires are connected to the sensors from opposite sides of the actuation module 120 such that the cables of the two sensors are not wrapped/tangled during the rotary motion. Otherwise, in cases where the sensors 130 include more than two sensors mounted on the actuation module 120 and connected by continuous wired connection to the controller 140, then rotary motion of the sensors is not used, but instead the actuation module 120 is configured to apply oscillatory motion (back and forth) motion to the sensors such that their respective continuous wired connection does not wrap/tangle.

In this embodiment the controller 140 may be adapted to obtain actuation data AD indicative of the position state of the actuation module 120 and more specifically indicative of the positions of the sensor(s) S1 and optionally S2. In some embodiments the controller 140 is adapted to process the magnetic field measurements obtained from the sensors when the later which are mounted on the actuation module traverse certain specific positions, such as SP1 to SP6.

For instance, Table 1 shows magnetic field measurement signals obtained and processed by the controller 140 and different times for obtaining/calculating a gradiometer signal $GS_M$ that is modulated in accordance with the displacement function data AD between the sensing positions of the sensors S1 and optionally S2 sensors' during their movement by the actuation module 120 (which may be for example a conveyor system on which the sensors S1 and optionally S2 are mounted). It should be noted that for clarity, Table 1 shows a discrete case in which magnetic field measurements from the sensors and the modulated gradiometer signal are obtained/processed when the sensors are located at a certain discrete set of positions SP1 to SP6. It should be however understood that generally in this embodiment of the invention the sensors are moved continuously, and accordingly the modulated gradiometer signal $GS_M$ and the displacement function data AD may be obtained and processed as continuous functions.

TABLE 1

| Time Frame | Position of S1 | Position of S2 | $GS_M =$ | Displacement (AD) |
|---|---|---|---|---|
| #1 | $SP_1$ | $SP_6$ | $MG(S_1)\text{-}MG(S_2)$ | $\overline{SP1\text{-}SP6}$ |
| #2 | $SP_2$ | $SP_5$ | $MG(S_1)\text{-}MG(S_2)$ | $\overline{SP2\text{-}SP5}$ |
| #3 | $SP_3$ | $SP_4$ | $MG(S_1)\text{-}MG(S_2)$ | $\overline{SP3\text{-}SP4}$ |
| #4 | $SP_4$ | $SP_3$ | $MG(S_1)\text{-}MG(S_2)$ | $\overline{SP4\text{-}SP3}$ |
| #5 | $SP_5$ | $SP_2$ | $MG(S_1)\text{-}MG(S_2)$ | $\overline{SP5\text{-}SP2}$ |
| #6 | $SP_6$ | $SP_1$ | $MG(S_1)\text{-}MG(S_2)$ | $\overline{SP6\text{-}SP1}$ |
| . | | | | |
| . | | | | |
| . | | | | |

Thus, as shown in Table 1, in this particular example the actuation module 120 translates the sensors S1 and S2 to repeatedly move in between the sensing positions SP1 to SP6. Six time frames are indicated in the table with the positions of the sensors at each time frame, the modulated gradiometry signal $GS_M$ which is computed by the controller in each time frame by subtracting the magnetic field $MG(S2)$ measured by one of the sensors from the magnetic field measured by the other sensor $MG(S2)$, and the displacement function AD by which the modulated gradiometry signal $GS_M$ is being modulated and which indicates the displacement between the sensors at each of the time frames.

As described above and also described in more detail below, the controller further operates to demodulate the modulated gradiometry signal $GS_M$ based on the predetermined displacement function (displacement data) AD for obtaining a demodulated gradiometry signal $GS_D$ in which the level of 1/f noise is suppressed/eliminated/substantially reduced.

Indeed the internal 1/f noise is generally the dominant noise component impairing the SNR of magnetometry measurements which are performed at low frequencies (e.g., <10 Hz). However, as indicated above the technique of the present invention provides for suppressing and/or entirely eliminating this 1/f noise component or shifting the measurements to the higher frequencies range. To this end, once the 1/f noise is suppressed/eliminated, other noise components, generally referred to herein as cumulative noise may become the prominent limitation on the accuracy of gradiometry measurements. The phrase cumulative noise is used herein to refer to noise that is introduced to the gradiometry signal which is computed by magnetic field measurements taken at different sensing positions by two separate/different sensors and/or by the same sensor at different times, due to a difference in the state of the sensor sensing the magnetic field at different sensing positions.

FIG. 2D is a graphical illustration schematically exemplifying the effect of cumulative noise, which is dominated by heading errors, on a measured gradiometer signal as a function of frequency for two sensors. Here, the X axis is the frequency (in arbitrary units) and the Y axis is the amplitude of the signal in arbitrary units. Graph G1 shows the response of the sensor at a first heading angle with respect to the magnetic field, and graph G2 shows the response of same sensor at a different heading angle. As shown, the Larmor frequencies (indicated by the peaks W1 and W2) are different in the different graphs G1 and G2, indicating that a different magnetic field is measured by sensors in different orientations, and more specifically showing that the magnetic field measurement depends on the orientation of the sensors with respect to the magnetic field. This is a source of cumulative heading errors which might be introduced to a gradiometer signal obtained from the measurements of two sensors at slightly different orientations. FIG. 2E is a graphical illustration exemplifying the effect of cumulative noise on a measured gradiometer signal obtained from two magnetometer sensors (e.g. two vapor cell based sensors) as a function of their measurement frequency. The typical noise signal (the noise behavior) of each of the sensors is exemplified the graph G3, whereby the figure shows a typical noise graph of one of the sensors, and it is understood that the noise from the second sensor used for the gradiometry can be represented by a somewhat similar graph. The graph G4 shows the non correlative part of the noise from the two sensors which is not canceled during computation of the gradiometry signal and therefore adds up to introduce the so called cumulative noise to the gradiometry signal. This commutative (non correlative) noise may be contributed by difference between the sensors resulted for example from or different filling substances/compositions in the vapor cells of the sensors and/or different headings of the sensors. The graph G5 shows the part of the correlative noise between the sensors which is thus cancelled out during computation of the gradiometry signal. As shown, the non-correlative part of the noise from the sensors may, in some cases, impair the gradiometry signal obtained from two (or more) separate sensors (namely from two sensors associated with different vapor cells).

To this end, prominent constituents of cumulative noise in this case include, among others, heading error cumulative noise which is introduced due to no correlated variation in the heading errors of the sensors at the different sensing positions (due to sensor(s) various orientation(s) with respect to the magnetic field), and internal error cumulative noise, which is a result of an inherent difference between different sensors at the different sensing positions (e.g. due to practically un-avoidable difference in the composition of the substance filling the vapor cells of the different sensors).

As indicated above, to some extent (in some cases, even most of) cumulative heading error noise can be suppressed according to the present invention by utilizing the orientation stabilization assembly 125 which adjusts and possibly correlates the orientations of the sensor 130. However, when moving the sensors themselves to the different sensing positions, some residual heading error difference between the sensors at the different sensing positions may still remain.

As for cumulative internal noise, which is due to the inherent difference between the sensors, this may be suppressed to some extent by providing calibration data for the respective sensors S1 and S2 and configuring the controller 140 to calibrate the magnetic field measurement signals from the different sensors 130 based on the calibration data, and prior to computation of the gradiometer signal. However, such calibration, even if accurate, does not compensate for temporal variations in the internal substance filling the vapor cells of the sensors (e.g. whose variations may be caused for example due to temperature changes), and thus may not compensate for the entire cumulative internal noise in the gradiometer measurements.

Reference is now made to FIG. 2G showing another embodiment of the gradiometer system 100 of the present invention, which includes a single, relatively large multipoint atomic sensor S1 which is used to measure the magnetic field at different sensing sites/channels e.g. ST1 to ST6, at different sensing positions along the large vapor cell LVC of the large multipoint atomic sensor S1, without requiring actual movement of the sensor S1 itself at which the magnetic field MG can be measured. Here, without loss of generality, six sensing sites/channels ST1 to ST6 are illustrated, however it should be understood that the number of sensing sites/channels is not limited in general and may vary according to application and implementation of the system.

This embodiment, which utilizes a single multipoint scalar atomic sensor, may provide superior results in terms of cumulative noise in the gradiometry measurements. This is because since a single sensor is used to measure the magnetic field at different sensing sites/positions, therefore the heading errors, even if they exist, are similar in the magnetic field measurements taken at the different positions (since it is the same sensor with the same orientation) and thus they are practically canceled out (suppressed/eliminated) when computing the gradiometry signal. Also, since the common vapor cell LVC is used, the composition and pressure of the substance filling the vapor cell is substantially similar and is timely correlated in the different sensing positions thus practically eliminating/reducing/suppressing the cumulative internal noise.

In some implementations this embodiment may yield superior results in terms of the level of 1/f noise, since in this case the sensing positions are moved by switching the sensing sites of the sensor S1 from which the gradiometry signal is calculated, while without moving the sensor S1. Also in some implementations the signals from each sensing site/channel e.g. ST1 to ST6, along the large vapor cell LVC of the large multipoint atomic sensor S1, are readout contentiously (and simultaneously) and the output gradiometry signals are obtained by proper/corresponding sampling of the readout channels according to the predefined variation function, and/or by moving (e.g. sliding) the sensing channels ST1 to ST6 along the vapor cell. This allows fast, virtual, movement of the sensing positions (as compared to the mechanical case in which the entire sensor S1 is moved) and thereby permits higher measurement frequency. This provides for overcoming the fundamental 1/f noise gradiometry measurement limitation possibly without the need for any mechanical movement. As well, as was indicated above, due to the fact that all sensing sites are situated on (within) the same large vapor cell, and thus the interaction is with the same atomic media, this causes high correlation in between the different sensing positions and, therefore in their noise behavior. Due to such correlation, the overall cumulative noises in the gradiometry operation are sufficiently reduced or even diminished.

In this regard, it should be noted that the phrase multipoint scalar atomic sensor is used herein to designate an atomic sensor, which includes a large vapor cell LVC (e.g. elongated vapor cell with size/length dimension in the order, for example, of several decimeters or even larger, i.e. several meters), along which there are a plurality of sensing sites, generally $\{ST_i\}$ arranged, for example in an array along the large vapor cell LVC. In this particular example there are six sensing sites ST1 to ST6, although it is understood that generally there may be a different number of sensing sites. An example of such a multipoint vapor cell is provided for instance in PCT patent publication No. WO2012/038948 (see for instance FIGS. 7 and 8 therein), which is assigned to the assignee of the present application. For example, the multipoint vapor cell may be configured with a waveguide or fiber optics assembly connected to the different sensing sites of the large vapor cell and adapted to provide the pumping radiation and/or to collect the radiation response from the sensing sites on the vapor cell.

According to the embodiment of FIG. 2G, the magnetic field MG measurements at the different sensing positions can be performed either by selectively operating (switching between) the plurality of sensing sites (e.g. ST1 to ST6) of a same/single multipoint atomic sensor S1 having a large vapor cell LVC at which the sensing sites are arranged and/or by operating the sensing sites/channels contentiously (and simultaneously) while selectively sampling the readouts of different sensing sites at different times according to the predefined displacement function, so as to practically move the sensing position(s) at which the magnetic field is sensed according to the predetermined displacement function, with no need to actually move the sensor S1 itself.

Here the sensor S1 includes several separate magnetometer sensing assemblies/channels arranged to define the respective sensing sites $ST_i$ coupled to the common vapor cell LVC. A magnetometer sensing assembly at each sensing site $ST_i$ of the sensing sites ST1 to ST6 generally includes means such as a radiation/optical source or port RP for illuminating the gas within the vapor cell LVC at the sensing site with appropriate illumination, such as polarized light from a laser at a specific wavelength, to thereby excite/pump the gas atoms with resonant excitation energy (e.g. matched to the Larmor precession frequency) and cause the atoms to precess together simultaneously with a common phase; a detector/probe, such as a photodetector PD, which is adapted to detected the precession signal indicative of the precession of the gas/vapor atoms at the sensing site STi (the sensing sites may be associated with separate photodetectors PD1 and PD2 and/or with photodetectors PD1 and PD2 being formed as different pixels of a photodetector array), and optical elements, such as mirrors MR, polarizers PL, polarization rotators $\lambda/2$, $\lambda/4$ and/or other elements, defining polarization of the radiation and/or the optical path of the radiation from source/port RP across a region of the vapor cell VC near the sensing site $ST_i$ and towards the detector/probe $PD_i$. To this end, each sensing site $ST_i$ is associated with means for exciting the atoms in the large vapor cell LVC and with means for probing/detecting/measuring the precession signal, which is indicative of the magnetic field sensed by the atoms near the sensing site $ST_i$. Thus according to some embodiments the sensing sites (magnetometer assemblies) are arranged along the vapor cell, where each sensing site may include Bell-Bloom laser setups, including a radiation port for laser pumping and a probe/photodetector. To this end, at least two specially separated magnetometers are situated at different sensing sites {ST} on the same large vapor cell VLC. The entire structure of the large vapor cell LVC provides one common inner space (common volume) and common mixture of filling substances (e.g., alkali vapor atoms (e.g. Cesium) with a mix of buffer gases (e.g., neon and/or nitrogen of different concentrations at different pressures).

It should be noted that the large vapor cell LVC may be generally of an arbitrary shape that can be lengthened in one or more directions. For example large vapor cell LVC may be in the form of glass tubing composed of one or several connected glass tubes (e.g., crossed tubings, frame/star configuration, etc.). In some implementations the multipoint atomic sensor with the large vapor cell LVC is configured and operable to allow moving/displacing the sensing positions along one direction (i.e. 1D configuration). It may be configured as a single vapor cell, having a rectangular cross-section and extended along one of its axes (e.g. Z).

Alternatively or additionally the large vapor cell LVC may include multiple arms where the orientation of different arms (glass tubing) can be different respectively to one another, i.e., the XY cross-sections of the corresponding tubing can be turned to an arbitrary angle. Considering the arbitrary shape—e.g., crossed/frame/star shape along several axes with several magnetometers, operated on the same "inner material space" will allow the detection of a spatial magnetic signature with respect to several axes (e.g., XY). In this case, enabling detecting the vector components of the gradient of the magnetic field with respect to several axes may facilitate tracking the location of the anomaly ANM with a single gradiometer system.

In the embodiment illustrated in FIG. 2G consideration is given to the possibility of arbitrary angle of the directions within the tubing cross section (and thus the relative direction of the laser beam/s for each magnetometer). This provides variety beam propagation directions and angles with respect to the direction of the vector of the Earth's magnetic field. More specifically, in this configuration one round trip between laser input into the cell and its output towards the detector includes two (or more) rays propagating in various angles across the cell. Preferably the mirrors reflecting the rays back in to the vapor cell are adjusted/tuned such that the two or more rays are separated by a certain angle which is larger than the critical dead-zone angle. Therefore, in this configuration even if one of the rays is exactly collinear with the dead zone, the other part (e.g., a reflected ray) is turned to propagate at an angle that is higher than the critical angle with respect to magnetic field, thus eliminating/reducing the dead-zone of the magnetometer (e.g. such that the overall signal never zeroes in the presence of a magnetic field).

According to various embodiments of the present invention, such as that exemplified in FIG. 2G, the multipoint atomic sensor may be configured and operable to provide dead zone cancellation, for reducing and/or diminishing the angular extent of the dead zone of the sensor. In such embodiments the sensing sites/channels {ST} (magnetometer assemblies) which are arranged at one or more lengthened/elongated arms of the large vapor cell LVC are configured such that the radiation/laser port RP outputs a laser beam at a certain (e.g. arbitrary) laser input angle, and several (e.g., at least one) optical deflectors MR (e.g. mirrors), which are arranged to deflect the optical path of the laser beam at different accurately chosen angles, so that the laser beam passes several times (e.g. at least two, or three times as illustrated in the figure) with different angles across the vapor cell LVC before reaching the detector/probe PD. More specifically the mirrors are arranged such that the relative angles between at least two of the multiple paths/trajectories of the laser beam across the vapor cell are generally larger than the dead zone critical angle $\theta$ (which is typically about 6-8 degrees). This provides for reducing the angular extent of the dead zone influence of the sensing site and possibly cancels the dead zone limitation altogether. This is because even in case when a certain pass/trajectory of the light ray from the laser through the vapor cell VLC is aligned in parallel to the magnetic field MG which is to be sensed and thus does not "polarize" alkali atoms in the vapor cell (generates no signal indicative of the magnetic field), another path/trajectory of the ray through the vapor cell VLC connected to the previous path by the mirrors' MR reflection) would be rotated at some angle relative to the previous pass by an angle larger than a dead zone critical angle $\theta$ and would therefore excite alkali atoms in the vapor cell and cause generation of a signal indicative of the measured magnetic field MG. Therefore, this configuration enables dead zone free operation, and provides optimized SNR irrespective of the direction of the Earth' magnetic field.

According to various embodiments of the present invention the sensing sites are not fixedly located on the large vapor cell VLC and their sensing positions (the locations of the magnetometer assemblies coupled to at different sensing sites {ST}) may be moved by the actuation module 120. In this case the actuation module 120 may be a mechanical module (for instance including one or more motors and/or mechanical transmission assemblies coupled to the sensing sites (to their magnetometer assemblies) and adapted for moving them for changing their sensing positions {SP} (changing the locations of the sensing sites ST at which the magnetometer assemblies are coupled to the large vapor cell LVC). This may be achieved, for example, by sliding one or more of the magnetometer assemblies along a lengthened arm/tube of the large vapor cell LVC in a certain manner/frequency/speed along the lengthened arm direction. In this case the actuation module 120 may be configured and operable as a mechanical module mechanically coupled to the sensing sites ST (to their magnetometer assemblies) and configured for moving them along the large vapor cell, according to the desired displacement function AD.

Alternatively or additionally according to some embodiments the sensing sites/channels {ST} with their magnetometer sensing assemblies are fixedly coupled to the large vapor cell LVC at fixed positions therein (thereby forming fixedly coupled sensing sites on the large vapor cell). In such embodiments the actuation module 120 may be an electronically actuation module which actuates/moves the sensing positions {SP} by electronically/optically switching between the sensing sites {ST} from which signals are obtained according to the predefined function (e.g., harmonic function) and used for computing the gradiometry signal(s) $GS_M$ at each time frame for any "sensors" pair; i.e., several gradiometer signals can be obtained from a single large sensor at each time frame. In such embodiments the actuation module 120 may be implemented as an electronic/electro-optic circuit and/or computerized system, which is configured and operable for determining, at each time step/sample of the measurements, which of the sensing sites, e.g. ST1 to ST6 needs to be probed/sampled for measuring the magnetic field, in order to compute a modulated magnetic field gradient signal $GS_M$ from the measurements obtained from two or more pairs of the sensing sites (e.g. ST1 to ST6) so as to simulate a movement of the sensing positions at which the magnetic field MG is sensed according to the predetermined displacement function.

For instance, in this example of FIG. 2G the six sensing sites ST1 to ST6, are fixedly arranged at the large vapor cell LVC along a specific axis (e.g. along the vertical axis). Generally, the sensing sites may be situated in any arrangement along the vapor cell, (e.g. arranged at regular/even spaces along a particular axis of the vapor cell). In this particular embodiment the sensing sites are arranged in a non-regularly spaced array, such that the separations between them are in a sine-like manner, such that regular sampling of different pairs of the sensing sites at a fixed rate (e.g. sampling the pairs indicated for example in Table 2 below with fixed sampling rate (fixed time intervals between the sampling time frames) would imitate a pseudo sinusoidal displacement function (sinusoidal/harmonic relative motion) between the sensing positions, thus providing a sine-like modulation along the specific axis at which the sensing sites are arranged. In this case the actuation module 120 may be an electronic module configured to provide the following displacement data AD and sensing sites data indicated in Table 2 in the following in order to simulate sinusoidal movement of the sensing positions.

Alternatively or additionally, in some embodiments the sensing sites (e.g. ST1 to ST6) are fixedly arranged in an array with regularly/even spaces along a certain (e.g. vertical) axis of the large vapor cell LVC. In such embodiments, a virtual displacement function simulating/emulating the "conveyor type movement" of the sensors S1 and S2 of FIG. 2F (as described in Table 1 above) would be obtained in case the actuation module 120 provides the displacement data AD indicated in Table 2 and the sampling rate is fixed (even time intervals between the sampling time frames).

TABLE 2

| Time Frame | First Sensing Site | Second Sensing Site | $GS_M =$ | Displacement (AD) |
|---|---|---|---|---|
| #1 | $ST_1$ | $ST_6$ | $MG(ST_1)-MG(ST_6)$ | $\overline{SP1-SP6}$ |
| #2 | $ST_2$ | $ST_5$ | $MG(ST_2)-MG(ST_5)$ | $\overline{SP2-SP5}$ |
| #3 | $ST_3$ | $ST_4$ | $MG(ST_3)-MG(ST_4)$ | $\overline{SP3-SP4}$ |
| #4 | $ST_4$ | $ST_3$ | $MG(ST_4)-MG(ST_3)$ | $\overline{SP4-SP3}$ |
| #5 | $ST_5$ | $ST_2$ | $MG(ST_5)-MG(ST_2)$ | $\overline{SP5-SP2}$ |
| #6 | $ST_6$ | $ST_1$ | $MG(ST_6)-MG(ST_1)$ | $\overline{SP6-SP1}$ |
| . | | | | |
| . | | | | |
| . | | | | |

Thus, as shown in Table 2, in this embodiment the actuation module 120 is configured to operate according to a predetermined displacement function AD indicative of a displacement between the sensing positions at which to measure the gradiometry signal $GS_M$ as a function of time. As indicated above, the predetermined displacement function AD, actually modulates the gradiometry signal $GS_M$ measured in this way. The data indicative of the displacement function may be for example stored in a memory associated with the actuation module 120 (in case the layer is a computerized system) or it may be indicated by a signal of a local oscillator of the actuation module 120 in case it is implemented by an analogue circuitry. Accordingly actuation module 120 is configured and operable to provide the controller 140 with displacement data/signals AD indicative of at least a pair of sensing sites including a first and a second sensing site, $ST_i$ and $ST_j$, from which the controller 140 should obtain magnetic field measurements $MG(ST_i)$ and $MG(ST_j)$ at each time frame, and based on which it should calculate the value of the modulated gradiometry signal $GS_M$ for the time frame.

Alternatively or additionally, all sensing sites may be configured and operable for continuous and optionally simultaneous operation, while the sampling is performed in accordance with the predefined displacement function.

Accordingly, based on the displacement data/signals AD, the controller operates (and or samples) the respective sensing sites $ST_i$ and $ST_j$, of the sensor S1 to obtain magnetic field $MG(ST_i)$ and $MG(ST_j)$ measured thereby. To this end the controller may include an inter-switching mechanism for selectively switching between the sensing sites from which magnetic measurements are provided at each moment in accordance with the displacement data/signals AD. The controller 140 calculates the gradiometry signal as a difference between them. As each sensing site $ST_i$ is associated with a corresponding sensing position $SP_i$, the displacement data AD is actually indicative of the displacement between the sensing positions which are used for calculating the gradiometry signal $GS_M$, which is therefore modulated accordingly. Further, as described above and described in more detail below, the controller 140 operates to demodulate the modulated gradiometry signal $GS_M$ based on the predetermined displacement function (displacement data) AD an thereby obtains a demodulated gradiometry signal $GS_D$ in which the level of 1/f noise is suppressed/eliminated/substantially reduced.

It should be noted that gradiometer system 100, configured according to the embodiment of FIG. 2F, in which the sensing positions are displaced by actually moving the sensors 130 (S1 and optional S2), may be advantageous in cases where use of a single sensor having a large vapor cell (such as LVC of FIG. 2G) is not desired.

On the other hand, as indicated above, gradiometer system 100 configured according to the embodiment of FIG. 2G, which utilizes a single large atomic sensor S1 having a single large vapor cell LVC with a plurality of sensing sites arranged thereon, may be advantageous in terms of the level of reduction of the 1/f noise and/or also in terms of the level of the cumulative noise components, such as cumulative heading errors and/or cumulative internal noise, which are reduced due to the correlation between different sensing sites/channels (the correlation originated due to the fact that the sensing sites are coupled to the same sensing-media/vapor-cell). This further improves the SNR of the gradiometry measurements. This is because in this embodiment a single vapor cell is used to selectively sense the magnetic field MG at different sensing positions simultaneously, while obviating a need for utilizing more than one sensor to simultaneously sense the magnetic field at different sensing positions and also obviating a need for moving one or more small scalar atomic sensors (the sensors S1 and optionally S2 of FIG. 2F) to different sensing positions.

In this regard it should be noted that when utilizing the single multipoint sensor S1 illustrated in FIG. 2G, the displacement of the sensing positions may be practically performed at much higher rates, as compared to the embodiment of FIG. 2F, in which the sensors themselves are mechanically moved. This is because in this case there are no moving parts/sensors, and therefore there is no need to worry about the structural integrity of the sensors during fast movements/accelerations thereof. In this example, when utilizing the multipoint atomic sensor, "mutual relative motion" between the sensing positions {SP} is possible by simply electronically switching between the sensing sites $ST_i$, which are considered at each moment for calculating the gradiometry signal $GS_M$ and/or, in case all the sensing sites are operated continuously and simultaneously, by switching between samples from different channels (i.e., providing different pairs of gradiometers from one large sensor at each sampling point). Such switching, which may be performed electronically and/or computationally for selectively obtaining the magnetic field measurements from selected sensing sites at each time, is independent of any actual movement of the sensor S1 and can thus be performed with high switching frequency/rate to emulate fast movement of the sensing positions (much faster than is practically possible by actually moving the sensors). This will decrease dependence on 1/f noise in the measured signal since it is with inverse relation/proportion to the switching/sampling frequency (which corresponds to increase in the rate at which the measured gradiometer(s) signal $GS_M$ are modulated). Therefore, this embodiment enables to suppress the 1/f noise in the signals to lower levels than those practically possible with mechanical movement of the sensors.

Also it should be noted that the level of accumulated internal noise in the gradiometry signal may be in some cases lower in embodiments which utilize the multipoint atomic sensor (as in FIG. 2G), as compared to embodiments in which several atomic sensors are used to compute the magnetic field gradient signal. This is because generally in atomic sensors errors/deviation of the magnetic field measurements may be introduced due to variations in the composition of filling species/substance within the vapor cells of the sensors. However, in the multipoint atomic sensor, the magnetometer sensing assemblies at the sensing sites $ST_i$ are optically coupled to a common (large) vapor cell LVC having common inner space having common volume and common mixture of filling substances (similar concentrations and partial pressures of the alkali vapor atoms (e.g. Cesium) and the buffer gases (e.g., neon and/or nitrogen)) within the vapor cell. Accordingly, when coupled to the same vapor cell VLC being approximately at thermodynamic equilibrium, the magnetometer sensing assemblies at the sensing sites $ST_i$ are optically coupled to the same mixture of species within the vapor cell, and therefore even if the magnitude of the magnetic field sensed thereby deviates due to the particular mixture of species within the vapor cell or change in the mixture or partial pressures therein, such deviation is common and correlative for all the sensing sites, and is generally canceled out when calculating the gradiometry signal $GS_M$ (subtracting the magnitude of magnetic field measured by one sensing site from the magnitude of the magnetic field sensed by another sensing site). More specifically, laser pumping at different sensing sites (different spatial locations) of the single vapor-cell will interact with nearly the same atoms populations and thus will produce the spin polarization uniformities at these sites. This means that probing of the same vapor cell at different points will enable to eliminate the major part of the noises sourced from the irregularities caused by different "interacting mixtures" (i.e., the materials mixture within the specific cell). Accordingly in embodiments utilizing the single multipoint vapor cells, the cumulative internal error/noise which might occur due to differences in the magnetic field measurements at different sensing positions are practically diminished or at least substantially reduced.

Also according to some embodiments of the present invention the radiation/optical ports RP of the plurality of sensing sites are optically coupled (e.g. via waveguide and/or grating and/or fiber optics) to a single/common laser source (not specifically shown) thereby providing synchronous pumping of the radiation to the same inner volume at the plurality of sensing sites {ST}. This provides for improving the precision and accuracy of the gradiometer system 100. This is because the level of noise behavior correlation for the signal taken at spatially different sensing sites is function of "inner material behavior". The higher the homogeneity level of the "inner space", the higher the signals correlation (e.g., sample signals taken at different spatial points), the simpler the noise reduction (since the noise is also correlative) and, therefore, the higher the sensitivity and measurement precision. Consequently, considering the fact of interaction with the common inner space (i.e., same substance species distribution and virtually the same condition)—high noise correlation (for different magnetometer channels) is an inherent feature of the single cell lengthened gradiometer, enabling a high level of noise reduction, reducing the limiting noise floor, and improving the SNR.

Figure 3A:
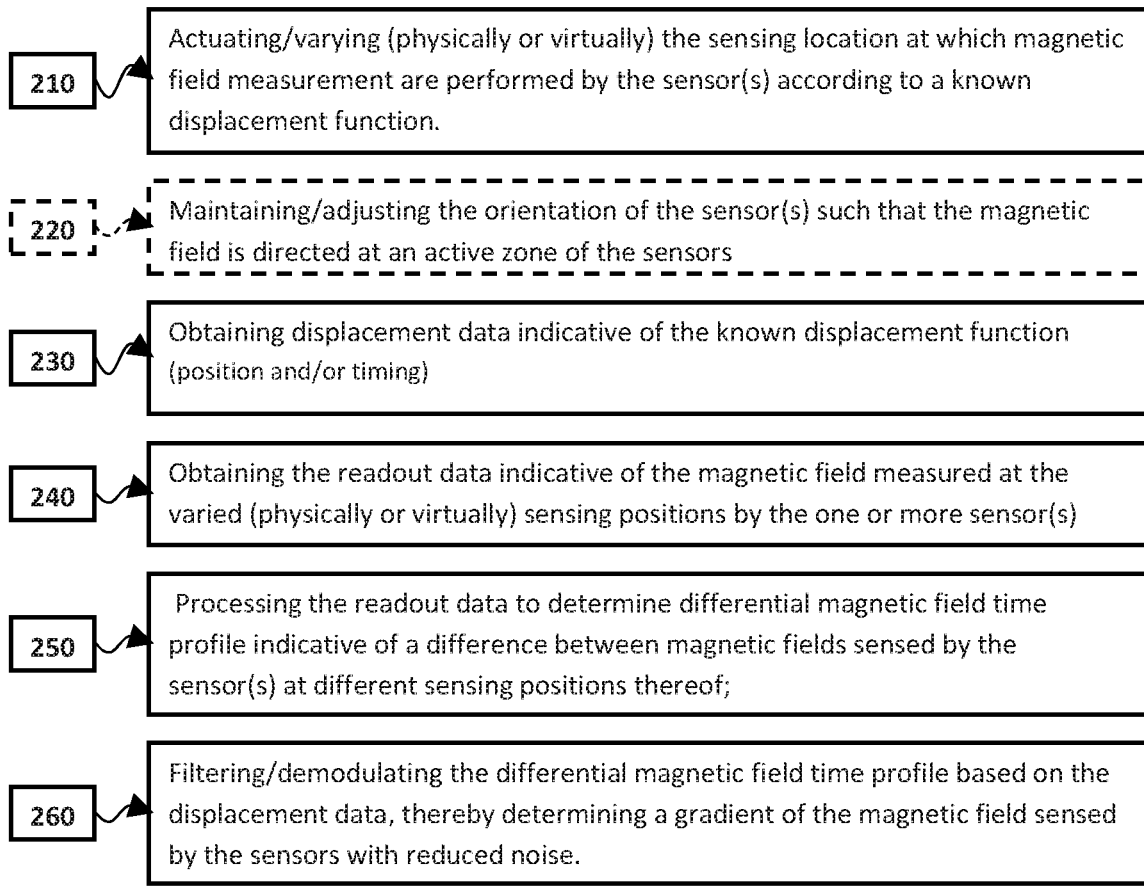
FIG. 3A is a flow chart of a method for measuring magnetic field gradient according to an embodiment of the present invention.
Figure 3B:
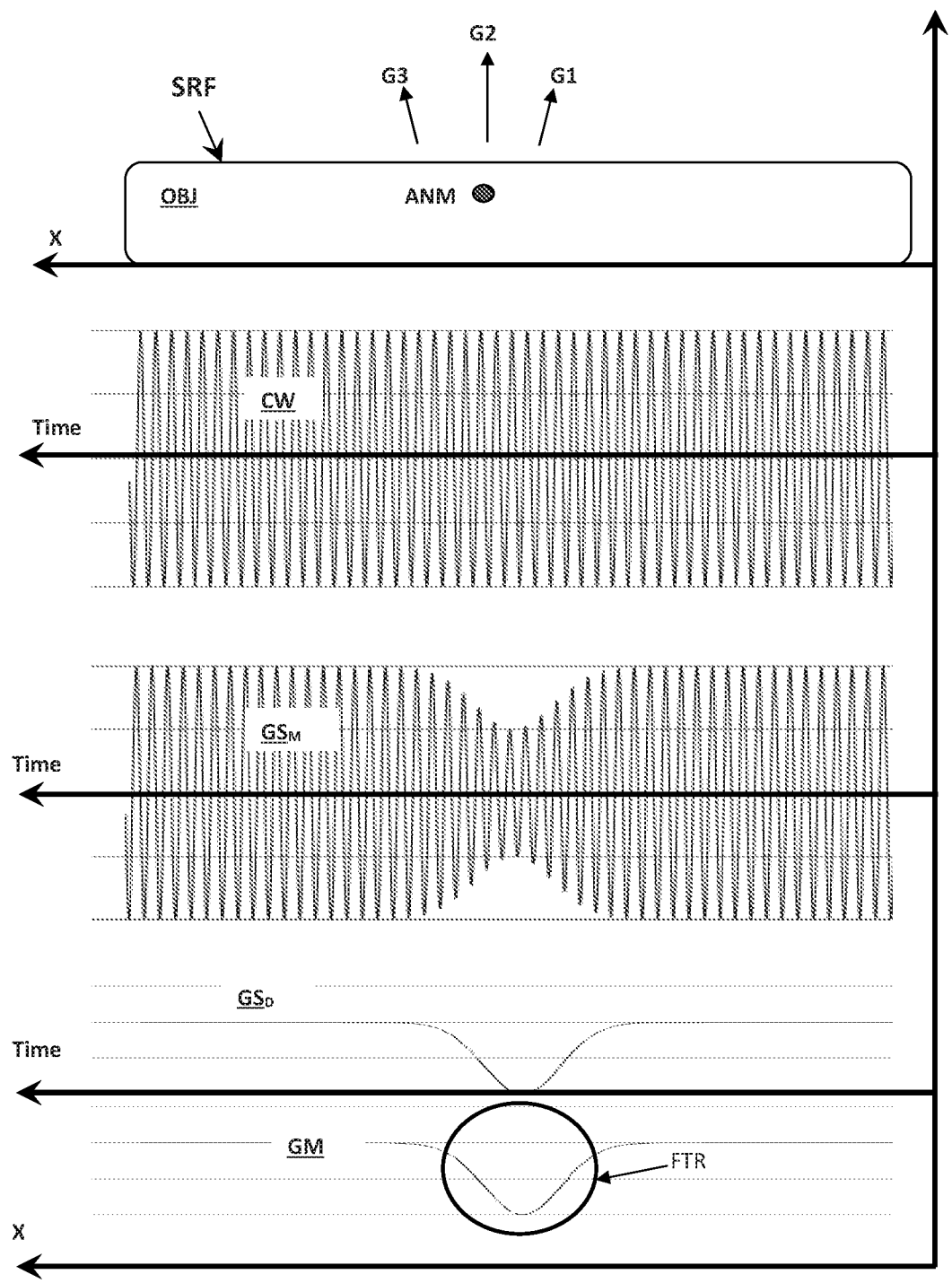
FIG. 3B graphically exemplifies data indicative of a magnetic field gradient obtained according to the embodiments of the present invention illustrated in FIGS. 2A, 2F and 2G.

Reference is now made to FIG. 3A which is a flowchart illustrating a method 200 according certain embodiments of the present invention of operation of the actuation module 120 and processing the readout data RD from the sensors 130 to determine/measure at least one vector component of a gradient of the magnetic field MG. The method 200 includes carrying out operations 210 to 260 described in the following:

In operation 210, the actuation module 120 is operated to actuate the sensing positions of at least one sensor S1 to repeatedly vary its position according to a known displacement function AD. Preferably the actuation of the sensing position is performed while maintaining the orientation of the sensors 130 constant relative to the horizontal plane and such that the magnetic field to be sensed is within the sensing zone of the sensor. More specifically, according to some embodiments of the present invention, at least one (e.g. S1) of the sensors 130, or at least one of the sensing positions whose magnetic field signal is used for computing the magnetic field gradient, is moved such that its displacement from a certain reference location RL (e.g. reference point/plane) alternates (namely alternately acquires positive and negative values) with certain periodicity(ies). The reference location RL may be considered a reference plane/point RL, typically fixed with respect to system 100, with respect to which the gradient is calculated. As will be further understood from the description below, the displacement function thereby defines a certain carrier wave CW which modulates the gradient signal $GS_M$ obtained by the system 100. An example sinusoidal carrier wave CW (in the case the sensing position(s) is/are moved harmonically) as a function of time and the modulated the gradient signal $GS_M$ which is consequently obtained/measured by the system 100 are graphically illustrated for example in FIG. 3B. The carrier wave CW may be composed of one or more periodic components (one or more frequencies corresponding to the motion of the sensor(s). An example of such a carrier wave CW which may be obtained by moving the sensing positions of the sensor(s) 130 up and down in an oscillatory motion with certain frequency is also illustrated graphically in FIG. 3C in conjunction with the sensor(s). Also illustrated in FIG. 3B is a gradient signal $GS_M$ which is obtained by differentiating the readout data RD obtained from the sensor(s) 130 at the different positions. The gradient signal $GS_M$ actually includes a modulated gradient signal component S, which is modulated by the carrier wave CW associated with movement of the sensing positions (for example with periodic (e.g. oscillatory/rotational movement of the sensing positions with period τ), and a non modulated 1/f noise component N.

In some embodiments of the present invention, the motion of at least one sensing position SP1 is one dimensional along a certain axis of motion (e.g. perpendicular to the reference plane). This is illustrated for example in FIG. 3C wherein the sensor S1 and optionally also sensor S2 (and therefore also of their sensing positions) are shown to move linearly in oscillatory/harmonic motion along the Z axis such that their distances from reference plane RL alternately acquire positive and negative values with certain periodicity(ies). Alternatively or additionally, similar one dimensional motion of the sensing positions may also be obtained with the gradiometer system 100 of FIG. 2G, by configuring the large vapor cell LVC with elongated shape and placing the sensing sites {ST} in an array along its length. In this case all the sensing sites (places) are fixed in their predefined positions (e.g., sensing points can be separated along an arbitrary axis in a way reflecting the projection of harmonic sine onto the axis). Several scenarios are possible to provide a "virtual motion" for moving the sensing positions, e.g., modulating/switching the operation of the sensing sites according to the predefined displacement function (i.e. which indicates the displacement between the sensing positions as function of time) and/or in cases where all the sensing sites (channels) are operated continuously and simultaneously, the sampling from specific channels is performed in accordance with the predefined displacement function.

Figure 3C:
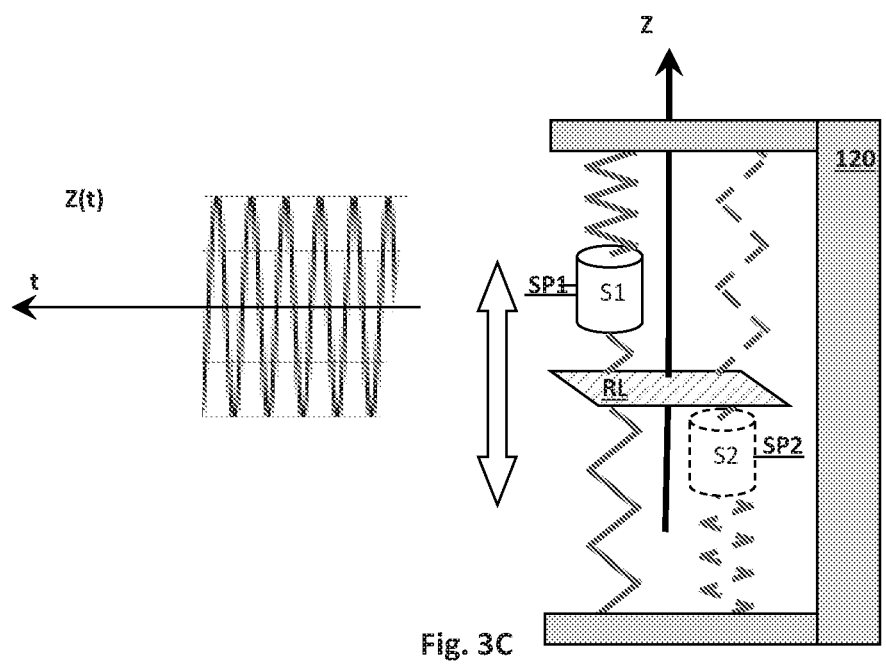
FIG. 3C illustrates the operation of the gradiometer system for one-dimensional movement of at least one magnetic sensor.

The evolvement of the distance of sensing position SP1 from the reference plane as a function of time t is illustrated in arbitrary units in the graph Z(t) in FIG. 3C. It should be noted that the springs representing the oscillatory motion of the sensing positions, as well as the double sided arrow indicating the direction of the oscillation, are not part of the system, and are only provided in the figure to illustrate the motion of the sensing positions. As will be described in more detail below, in this case of one dimensional motion of the sensor(s) along a certain axis (e.g. the Z in this example), the system 100 is capable of extracting the projection of the magnetic field gradient on the axis of the motion (e.g. Z) with improved sensitivity and accuracy.

Alternatively or additionally, the motion of the at least one sensing position (e.g. SP1 and possibly also SP2) may be a two dimensional motion within a certain plane. As will be described in more detail below, in cases where two dimensional motion of the actuation module is configured, such at least one of the sensing position, SP1 and possibly also SP2, (namely when its displacement from the reference location RL about which the gradient of the magnetic field is to be measured), alternates along two axes (e.g. Z and X) and provides that the system 100 is capable to extract the projection of the magnetic field gradient on these axes with improved sensitivity and accuracy.

It should be noted that a motion of the sensing positions SP1 and SP2 of the sensor(s), such as the oscillatory linear motion illustrated in FIGS. 3B and 3C, is provided here only as an example. It will be readily appreciated by a person of ordinary skill in the art, that other types of motions of the sensing positions in which the displacement of the sensor(s) from the reference location RL alternates with respect to at least one axis (e.g. Z) in between positive and negative values, are applicable for the technique of the present invention. These motions may be one dimensional motion along an axis, two dimensional motions within a plane, and also three dimensional motions (e.g. which may be implemented using 3D gimbals) allowing extraction of all three vector components of the magnetic field gradient with improved accuracy.

Turning back to FIG. 3A, in operation 210 the actuation module 120 moves (actually or virtually) one or more of the sensing positions SP1 and/or SP2 of the sensor(s) 130 in accordance with a known displacement function AD. To this end, as shown in optional operation 220, preferably in case where more than one sensor is used, the actuation module 120 is configured such that while the magnetic field signals from the sensor(s) are obtained while the sensing positions move, the orientation(s) of the sensor(s) is/are maintained/adjusted (e.g. are actively or passively adjusted) such that the magnetic field MG is directed towards an active zone of the sensors 130. More specifically, the orientation of the sensor(s) 130 of the sensors is adjusted/set such that the direction of the vector of the magnetic field MG of the surveyed object OBJ remains within the active zone(s) AZ, and is preferably varied by not more than 1-2 degrees relative to the sensors.

In operation 230 the controller obtains displacement data AD indicative of the displacement function $\bar{r}_{S1}(t)$ and optionally $\bar{r}_{S2}(t)$ of the sensing position(s) as a function of time. More specifically, the controller 140 obtains data indicative of the movement (actual or virtual) of the sensing positions as a function of time. This may be for example data indicative of the locations of the sensing sites from which to acquire magnetic field data at each time frame/step and/or data indicative of the vector positions of the sensor(s) S1 and optionally S2 as a function of time, and the controller may then determine the displacement function(s)/data AD characterizing the motion of the sensing positions.

In case, for example, that a single movable sensor S1 is used, the displacement data may be indicative of difference in the position $\bar{r}_{S1}(t)$ of the sensor at different times:

$$\overline{AD}(t) \sim \bar{r}_{S1}(t1) - \bar{r}_{S1}(t1 - \Delta t) \qquad \text{Eq. (1)}$$

In case two or more sensors S1 and S2 and or two or more sensing sites are included and used by the system, the displacement data may be indicative of a difference in the respective positions of two sensors/sensing sites whose signals are used for commutation of the magnetic field gradient at each time frame:

$$\overline{AD}(t) \sim \bar{r}_{S1}(t) - \bar{r}_{S2}(t) \qquad \text{Eq. (2)}$$

It is noted that generally this difference may also be taken with a time difference Δt in case operation 250 described below is also carried out to differentiate the readout data RD obtained from sensor(s) S1 and S2 with a time difference corresponding/matching to Δt.

To this end, in various embodiments of the present invention, the controller 140 may obtain the positions $\bar{r}_{S1}(t)$ and optionally $\bar{r}_{S2}(t)$ of the vectors may be achieved by the controller 140 in various ways. For example, the controller 140 may be configured to operate the actuation module 120 to move the sensor(s) and/or switch/sample the sensing positions in a predetermined fashion corresponding to certain known positions $\bar{r}_{S1}(t)$ and optionally $\bar{r}_{S2}(t)$ of the sensing positions as a function of time (such that a certain known displacement function is obtained between their locations at the same or different times. Alternatively or additionally, the actuation module 120 may be preconfigured/designed to move (switch/sample) the sensing positions in a certain a priori known fashion. In both these cases, the controller 140 may be associated with a memory, storing information corresponding to the movement of the sensors by the actuation module and indicative of the known displacement function/data AD as a function of time and/or of the positions $\bar{r}_{S1}(t)$ and optionally $\bar{r}_{S2}(t)$ of the sensing position(s) as a function of time. Alternatively or additionally, the controller 140 may monitor the sensing positions $\bar{r}_{S1}(t)$ and optionally $\bar{r}_{S2}(t)$ and thereby determine the displacement function/data AD by which the actuation module 120 moves them.

It should be noted that the phrase displacement function refers to a displacement vector between locations of one or more of the sensing positions, in between which the gradient of the magnetic field can be determined. The magnitude and/or direction of the displacement vector may vary/modulate in time, in accordance with the movement (actual and/or virtual movement/displacement) of the sensing position(s).

For example, in case the gradiometer system 100 includes one movable magnetic sensor S1 (e.g. the embodiment of FIG. 2F with only one sensor), the displacement function may be a function descriptive of the displacement/distance $\bar{r}_{S1}(t)$ of the sensor S1 from any reference position as a function of time. As explained above, in that case, displacement data AD used in the following for determining the gradient of the magnetic field MG may be obtained by subtracting the known displacement function of the sensor S1 from a time shifted ($\Delta t$) copy thereof, thereby obtaining displacement data indicative of the oscillation of the position of the sensor about a certain reference point. Typically, the displacement function describing the motion of the sensor S1 is periodic and has certain prominent periodicity with time period $\tau$.

In case the sensors 130 of the gradiometer system 100 include two or more sensing positions (e.g. associated with two or more sensors S1 and S2 included in the embodiment of FIG. 2F and/or associated with two or more sensing sites {ST} of the multipoint atomic sensor of FIG. 2G), the displacement function/data AD may be indicative of the displacement between two sensing positions 130 as a function of time.

In operation 240 the controller obtains readout information (data/signals) RD from the sensor(s) 130. The readout information RD is indicative of a time profile of the magnetic field MG (e.g. its magnitude) sensed at the sensing positions during their motion by one or more of the sensors 130.

For instance, a first order approximation of the magnetic field MG in the space at which the sensing positions are moved, can be estimated by the first orders of the power series expansion of the magnetic field as function of radius $\bar{r}$ as follows $\overline{MG(\bar{r})} \sim \overline{B}_0 + \nabla B \cdot \bar{r}$, where $\bar{r}$ is the position vector with respect to the reference location RL, and $\overline{B}_0$ and $\nabla B$ are zero and first order coefficients of the expansion series where $\nabla B$ is the gradient of the magnetic field along the direction of motion of the sensor(s). The movement of one of the sensing positions in the space may be expressed by vectors $\bar{r}_{S1}(t)$ and $\bar{r}_{S2}(t)$ as a function of time. As illustrated for example in FIG. 3C where the sensing positions SP1 and SP2 are moved along the Z axis relative to a reference location $\bar{r}=0$ with an oscillatory/harmonic motion of magnitude $\Delta z$ and period $\tau$, their respective sensing position $\bar{r}_{S1}$ and $\bar{r}_{S2}$ may be expressed by $\bar{r}_{S1}(t) \sim \Delta z^* \text{Sin}(2\pi t/\tau)\hat{z}$ and $\bar{r}_{S2} \sim -\Delta z^* \text{Sin}(2\pi t/\tau)\hat{z}$ where $\Delta z$ is the amplitude of the sensors' displacement motion, $\hat{z}$ is the unit vector in the Z direction and t is time.

In this case the readout data RD obtained from each of the sensing positions will include a signal component S representing a time profile of the magnetic field MG sensed thereby, plus noise component N representing the 1/f noise of the sensors. The signal component S obtained during the motion of the sensors can be expressed/estimated for example as follows:

$$S \sim Gn(\overline{B}_0 + \nabla B \cdot \bar{r}_S(t)) \qquad \text{Eq. (3)}$$

where Gn is a gain factor; Gn is associated with the amplification of the signal from the sensor (the gain factor Gn depends on the measurement time). Thus, the first order ($\nabla B \cdot \bar{r}_S(t)$) component in the signal S is modulated by the change in the position $\bar{r}_{S1}(t)$ of the sensor in time. The noise component N may be of the $1/f^\alpha$ kind and grow with power $\alpha - 1$ as a function of the characteristic time T of the measurement. Thus, for $\alpha = 1$, the noise component does not grow.

Without repeatedly/periodically moving/oscillating the sensing positions, the characteristic time of the measurement would be the time it takes the sensor to pass over the anomaly (ANM). The latter would depend on the speed of the anomaly ANM relative to the sensor (e.g. the speed of vehicle carrying the sensor) and the characteristic distance over which the anomaly ANM influences the terrestrial magnetic field. This characteristic distance is in some cases approximately twice the vertical distance between the anomaly ANM and the sensor (e.g. about twice the depth of the anomaly below ground at which the anomaly ANM is located). Note that the utilization of a moving platform for the gradiometry measurements is presented here as an example; in general cases it is not necessarily so.

However, when repeatedly/periodically moving/oscillating the sensing position(s), the signal sensed by the sensors is modulated, thereby reducing the characteristic time T of the measurement to the time period $\tau$ of the repeated movement of the sensors. This increases the frequency of the measurement, thus reducing the 1/f noise component.

The readout data RD from each of the sensors is indicative of the time profile of the magnetic field MG sensed by one or more of the sensors 130 plus the noise N.

As indicated above, it is an object of certain embodiments of the present invention to determine the magnitude of the gradient $\nabla B$ of the magnetic field MG while reducing the effects of the noise N in the result. This is achieved by the controller by processing the readout data $RD_S$ from one or more of the sensing positions SP1 and SP2 as described in the following operations 250 and 260.

In operation 250 the controller 140 differentiates the readout data RD (magnetic field) obtained/measured at the moving sensing positions s SP1 and SP2 to obtain a differential magnetic field time profile, $GS_M$, being the modulated gradiometer signal. $GS_M$ is indicative of the difference in the magnetic field MG sensed at the different positions modulated by the movement of the sensing positions.

For example, in case the system includes and operates two movable sensors (actual or virtual movement) S1 and S2, the differential magnetic field time profile (the modulated gradiometer signal) $GS_M$ may be obtained as the difference of the readout data/information $RD_{S1}$ and $RD_{S2}$ obtained from the sensors S1 and S2 (as exemplified in Table 1 above). As will be appreciated by a person skilled in the art, the difference may be taken while synchronizing/shifting the timings of the data readouts $RD_{S1}$ and $RD_{S2}$ from the sensors in accordance with their respective motions and desired reference location about which the gradient of the magnetic field MG should be obtained. In cases where a large multipoint atomic sensor having a plurality of sensing sites spatially spaced {ST} is used, the modulated gradiometer signal $GS_M$ may be obtained by selectively processing the readout data RD from a selected pair of sensing sites at each time frame (differentiating samples of the magnetic fields sensed by the selected pair), whereby the selected pair is selected in accordance with the desired displacement function AD which is to be emulated (as exemplified in Table 2 above).

In the example of FIG. 3C, the positions of the sensors are symmetric with respect to the reference location RL about which the gradient should be obtained, and therefore no time shifting is performed.

In case a single sensor S1 is used, or in an ideal case where two different sensors S1 and S2 which are almost identical and at the same orientation is used (such that the noise from their internal errors and heading errors is highly correlated between them), the cumulative noise from the two movable sensing positions will diminish. Accordingly, subtraction of the readings from the two sensors will result in the local gradient of the ambient magnetic field.

As for the 1/f noise from the sensors, as described above and further described in more detail below with reference to operation 260, this 1/f noise is diminished/reduced substantially when filtering/demodulating the differential magnetic field time profile $GS_M$ to extract a signal indicative of the magnetic field gradient $\nabla B$.

It should be noted that in case there are more than two sensors in the system 100, operations as mentioned above can be performed for any desired pair of sensors to obtain a modulated gradient signal indicative of the magnetic field gradient at the nominal/average position to the pair of sensors.

In case the system includes and/or operates only one movable sensor S1 (embodiment of FIG. 2F with a single moving sensor S1), the differential magnetic field time profile (the modulated gradiometer signal) $GS_M$ signal may be obtained as the difference of the readout data/information $RD_{S1}$ obtained from the sensors S1 at different positions thereof. As will be appreciated by a person skilled in the art, the difference may be taken while shifting the timings of the data readouts $RD_{S1}$ from the sensor S1 in accordance with its motion, so that the difference will be taken about an average location of the sensor, matching the desired reference location about which the gradient of the magnetic field MG should be obtained. In the example of FIG. 3C, the position of the sensor oscillates symmetrically with respect to the reference location RL with oscillation period τ. For instance, the controller may calculate the difference between the readout data $RD_{S1}$ and a time shifted copy thereof, that is shifted in time by a duration corresponding to about half the oscillation period τ/2 possibly multiplied by an odd integer number (generally (2n+1) where n is an integer or zero, typically selected to be 0). Accordingly, the differential magnetic field time profile $GS_M$ is determined. However in such embodiments where one sensor is used to obtain one or more vector components of the gradient $\nabla B$ of the magnetic field MG, the actuation module 120 is configured to displace/oscillate the sensors with a time periodicity r shorter than the Nyquist period $\tau_N$ of the magnetic field gradient measurement that should be eventually obtained (namely the displacement function AD is a periodic function having periodicity component with frequency in the order of, or higher, than Nyquist frequency component of the gradient to be determined). This is because when a single sensor is used, the gradient measurement cannot be obtained with frequency higher than half the frequency of the movement (which presents as the Nyquist frequency in this case).

As indicated above, the noise N of certain magnetic field sensors includes a prominent 1/f noise component with power α=1 or α=½. Thus, a prominent component of the noise becomes dependent on power α−1 of the periodicity τ of the movement of the sensing positions which is generally much shorter than the measurement duration t (or in other words, the noise becomes dependent on a power of the frequency w of the carrier wave CW modulating the signal S). This is true also for other values of α, particularly in cases where α≤1 which are common in magnetic field sensors.

The modulated signal component S is the projection of the gradient $\nabla B$ of the magnetic field MG on the displacement function $\overline{AD}(t)$, which is modulated according to the movement of the sensing positions. Accordingly, the signal component S actually corresponds to the magnitude $|\nabla B|_{proj}$ of the projection of the gradient $|\nabla B|$ of the magnetic field on the dimensions of the motion of the sensing positions (its projection on the 1D-axis/2D-plane/3D-volume of the motion) modulated by a carrier wave CW corresponding/matching to the displacement function $\overline{AD}(t)$ of the sensing position(s).

The waveform of the carrier wave CW of the modulation is associated with the particular movement/displacement of the sensing positions 130. In case of simple oscillatory and/or rotational motions of the sensors with fixed periodicities τ, as illustrated for example in FIG. 3C, the carrier wave CW may be a simple sinusoidal function. However, generally, with more complex motions of the sensing positions, the carrier wave may acquire complex functional forms (i.e. which might generally have/be composed of a plurality of frequency components in their Fourier spectrum). Thus as will be described below with reference to operation 260 by knowing the displacement function/data $\overline{AD}(t)$ of the sensors 130 as a function of time (as obtained in operation 230 above) the form of the carrier wave CW modulating the differential magnetic field time profile $GS_M$ can be determined, and, accordingly, the differential magnetic field time profile $GS_M$ can be demodulated based on that form of the carrier wave CW to obtain a demodulated signal/data $GS_D$ indicative of the magnetic field gradient sensed by the sensor(s) 130 as a function of time. In this regard, operation of the controller 140 is described in more detail below with reference to operation 260. An example of such demodulated signal/data $GS_D$ indicative of the time/spatial profile of the magnetic field gradient obtained by the system is shown graphically in FIG. 3B.

In operation 260 the controller 140 operates to filter and/or demodulate the differential magnetic field time profile $GS_M$ based on the displacement data AD, thereby determining the magnitude of at least one vector component of the gradient $\nabla B$ of the magnetic field MG sensed by the sensors while reducing/diminishing the noise, particularly the 1/f noise component. Hereinafter the operation 260 of extracting the value of the gradient $\nabla B$ (or one or more vector components thereof) is referred to generally as demodulation, however it should be understood that this term, demodulation, should be construed in a broad sense covering any suitable technique of signal/data processing/filtration by which data indicative of the gradient $\nabla B$ can be obtained from the differential magnetic field time profile $GS_M$. To this end, as will be readily appreciated by those versed in the art, such de-modulation/filtration of the differential magnetic field time profile $GS_M$, which is amplitude modulated (AM) by a known carrier CW corresponding to the displacement function $\overline{AD}(t)$, may be performed by various known in the art demodulation/filtration techniques, such as: (i) Envelope demodulation (e.g. by utilizing Hilbert transform and/or low-pass filtering); (ii) Coherent de-modulation; (iii) Square-law demodulation; (iv) Quadrature demodulation; and/or (v) possibly using other filtration schemes, for example by applying Fourier analysis to time frames of the differential magnetic field time profile $GS_M$ and filtering it based on the results of the analysis. Any one or more of these techniques, or other technique(s), may be used in various embodiments of the invention to process the modulated differential magnetic field time profile $GS_M$, which includes an AM modulation of this signal S modulated by the displacement function $\overline{AD}(t)$ of the sensors plus noise N, to determine a de-modulated differential magnetic field time profile $GS_D$ which includes/reconstructs the signal S while diminishing/reducing/suppressing the noise N.

Diminishing/reducing/suppressing the noise N is achieved, because while demodulating the modulated differential magnetic field time profile $GS_M$, the signal which oscillates with the frequencies (e.g. $\omega \sim 2\pi/\tau$) of the carrier CW (e.g. with periodicity $\tau$ of the displacement function $\overline{AD}(t)$) becomes demodulated, while other frequency components, such as frequency component of the noise N, which are not modulated by the carrier CW, are mostly filtered out from the de-modulated differential magnetic field time profile $GS_D$, except maybe for some residual noise components RN, associated with the part of the Fourier spectrum of the noise overlapping with the carrier CW. Yet such noise residue is generally small, as it corresponds only to the part of the noise N overlapping with the carrier CW (e.g. comprising the same Fourier frequency constituents as the carrier). Also, since it is the part of the noise overlapping with the carrier, and since the carrier is oscillating with characteristic period $\tau$, therefore the power density of the residue of the noise RN is typically proportional to the period $\tau$ of the carrier (instead of the characteristic time T). Accordingly, most of the noise N, particularly modes of the 1/f noise, is diminished from the de-modulated differential magnetic field time profile $GS_D$.

Thus, the effect of demodulation/filtration techniques, such as (i) to (v) indicated above, is to extract the portion of the differential magnetic field time profile $GS_M$ overlapping with the carrier CW. Indeed, as will be readily appreciated by those versed in the art, this can be achieved by having the controller 140 configured to implement any suitable known in the art demodulation scheme.

To exemplify the effects of such demodulation, provided below is a description of a particular demodulation scheme used for demodulating the differential magnetic field time profile $GS_M$. It should be understood that this demodulation is only provided as a non limiting example and that the invention can be implemented also by using other demodulation techniques and by configuring the controller 140 to perform such techniques via analogue means, and/or via digital means, and or a combination of analogue and digital means. To this end, demodulation can be achieved by providing and using the displacement function $\overline{AD}(t)$, which is indicative of the properties of the carrier CW, to generate (by analogue/digital means) a local representation (signal/data) of the carrier CW, and mix/multiply the local representation of the carrier CW with the differential magnetic field time profile $GS_M$, and averaging the results over time frames in the order of the period $\tau$ of the carrier CW.

It should be noted that according to certain embodiments of present invention the displacement function AD describing the motion/distance of the sensors 130 with respect to one another, and/or with respect to the reference location RL about which the gradient of the magnetic field MG is measured, is an alternating/oscillating function alternately acquiring positive and negative distance values with certain periodicity $\tau$. Preferably the function AD alternates symmetrically about zero. More generally, the phrase alternate symmetrically generally should be understood as periodic movement of the sensors 130 with periodicity $\tau$ such that the integral of the positive values of the displacement function AD(t)>0 equals the integral of the negative values of AD(t) <0. Therefore, since the carrier wave CW is proportional to AD(t) it satisfies the same condition (alternates symmetrically), and thus the power density of the noise is taken at frequency 1/$\tau$ which is much larger than the frequency based on the characteristic time (1/T). To this end, according to some embodiments of the present invention, the actuation module 120 is configured and operable to move the sensors 130 and/or the sensing positions/sites from which value of the modulated gradiometry signal $GS_M$ is calculated in each time frame, such that they alternate symmetrically relative to the reference location RL thereby enabling to reduce the noise via the demodulation of the readout data RD from the sensors 130. In cases where the controller 140 actively controls or adjusts the operation of the actuation module 120, the controller 140 may also be configured to operate the actuation module 120 to provide such symmetrically alternating displacement function AD(t).

Accordingly, utilizing this technique, most of the noise, particularly the 1/f noise, is diminished from the demodulated gradiometry signal $GS_D$. Yet there may be some additional noise components, associated with cumulative noise from the sensor(s) which may be less affected by this demodulation. As indicated above, these cumulative noise components may include cumulative heading errors associated with changes in the orientations (headings) of the sensors and cumulative internal noise errors associated with the difference in the structure and/or composition in the gas/substance filling the vapor cells in the different sensors. One way for reducing the cumulative heading errors according to the present invention is by carrying out meticulous adjustment of the orientation of the sensors during their movement, as described above with reference to the orientation stabilization mechanism in FIG. 2F. Another way to eliminate or reduce the cumulative heading errors according to the present invention is by using a single multipoint sensor as described above with reference to FIG. 2G for simultaneously sensing the magnetic field at the pair of a different sensing positions at each time frame. In this case the heading errors are the same/are correlated for both sensing positions, and thus are mostly canceled when computing the gradiometry signal. Also in this case(s) the single multipoint sensor may be static (e.g. fixedly located on the platform) and thus cumulative heading errors, if any, may practically not include substantial components in the frequency of the carrier wave, and are thus cancelled during the demodulation.

As for the internal noise errors caused by the difference between the sensors, these may be reduced in embodiments of the present invention in which a single sensor is used for sensing the magnetic field at the different locations, such as the embodiments exemplified in FIG. 2G and/or in implementations of the gradiometer of FIG. 2F with a single sensor. This is because in certain embodiments the measurements taken by the same sensor at different sensing positions are taken by the same sensor, the internal noise components in the different sensing positions are substantially correlated, and are thus cancelled in the measured gradiometry signal $GS_M$.

It should be noted that using a single moving sensor configuration (the embodiment of FIG. 2F implemented with a single sensor), there may also exist associated with detection aberrations caused by the time difference between the measurements, the readings of which are subtracted to calculate the gradient signal.

Figure 4A:
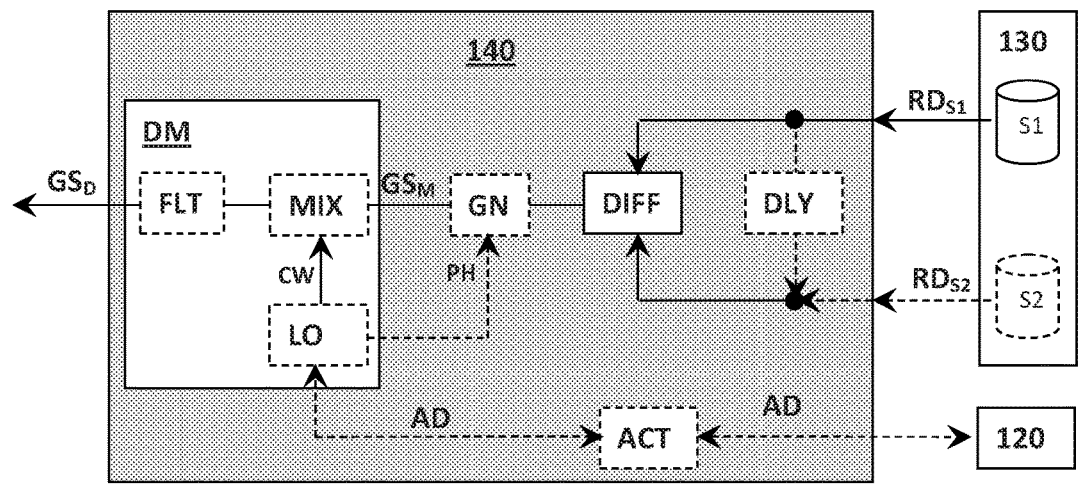
FIGS. 4A and 4B illustrate schematically analog and digital controllers, respectively, suitable for processing the sensed signals.
Figure 4B:
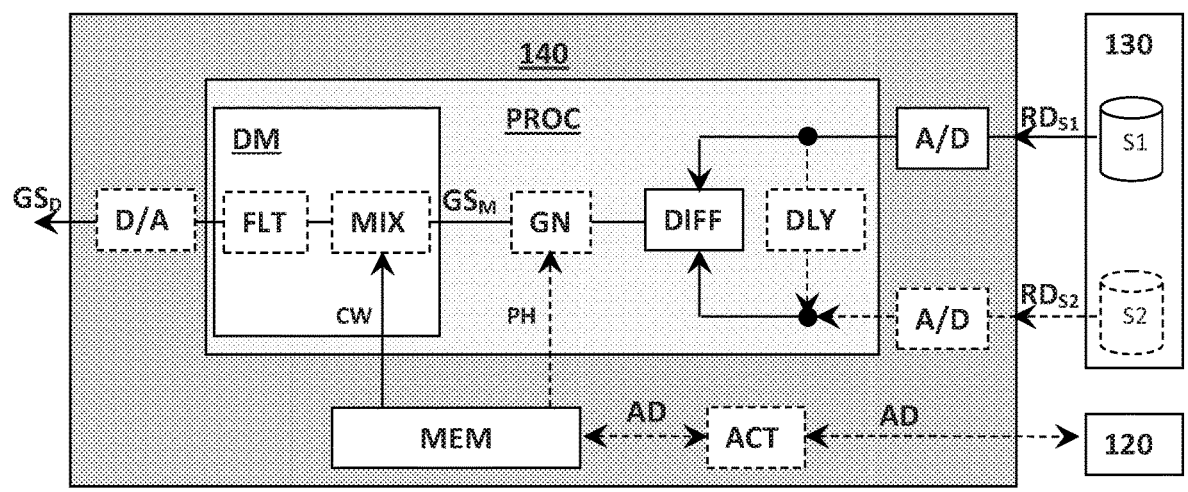

It should be noted that according to certain embodiments, in which the motion of the sensing positions may be in more than one dimension (such as 2D motion (e.g. rotation), or 3D motion—not specifically illustrated in the figures). Accordingly, in such embodiments, different vector components of the gradient of the magnetic field may be determined independently. This is because in this case the phase of the modulated gradiometry signal $GS_M$ that is modulated by the carrier wave CW corresponds to the direction of the gradient $\nabla B$ of the magnetic field in the plane/volume of the motion of the sensing position. Accordingly, in some embodiments of the present invention the controller 140 may be configured and operable for extracting data indicative of the direction of the gradient $\nabla B$ based on the phase of the modulated gradient signal $GS_M$. As indicated above, the technique of the present invention may be performed by utilizing controller 140 configured as an analogue signal processing module/circuit and/or as a digital signal processing module (e.g. computerized module). FIGS. 4A and 4B are block diagrams exemplifying implementation of the controller 140 utilizing analogue and digital means respectively. It should be noted that these examples are non limiting examples and that in view of the description above, a person of ordinary skill in the art will readily appreciate various other possible configurations of the controller 140 which can be used for implementing the invention.

For instance, FIG. 4A exemplifies analogue implementation of the controller 140 as an analogue signal processing circuit. In this example the controller receives readout information (e.g. readout signals) from the sensors 130, including readout signals $RD_{S1}$ from sensor/S1 and optionally, in case of two sensors, also readout signals $RD_{S2}$ from sensor S2. The controller 140 optionally includes an actuation controller module ACT, which operates and/or monitors and/or, is synchronized with, the operation of the actuation module and is capable of obtaining/providing AD signals indicative of the displacement function of the sensors over time. The sensors are mechanically coupled to the actuation module 120 and the readout signals $RD_{S1}$ and optional $RD_{S2}$ therefore include signal portion S which is indicative of the magnitude of the magnetic field sensed thereby, modulated by the displacement function AD. In the single sensor implementation, the readout signal $RD_{S1}$ is split into two substantially similar parts, and the controller includes a delay module/circuit DLY delaying/shifting one of the parts by predetermined time duration/shift (e.g. by a time shift of about half the period $\tau/2$ of the movement/displacement of the sensor S1). The readout signals $RD_{S1}$ and $RD_{S2}$ from the two sensors S1 and S2, or the two parts of the split signal $RD_{S1}$, are fed to differentiating module DIFF, which performs signal subtraction (i.e. subtracts $RD_{S2}$ from $RD_{S1}$, or subtracts the delayed part of the signal $RD_{S1}$ from the non-delayed part thereof) thereby generating modulated differential magnetic field time profile $GS_M$, which is indicative of the gradient of the magnetic field MG modulated by the displacement function AD.

Optionally, controller includes gain amplifier GN that is adapted to amplify/multiply the modulated differential magnetic field time profile $GS_M$ by a predetermined gain/amplification function Amp(t), which has a frequency component with frequency matching the periodicity $\tau$ of the displacement function AD of the sensors. Optionally, the gain/amplification function is selected to enhance sensitivity of said gradiometer 100 to magnetic gradients aligned in particular direction and suppress sensitivity of the gradiometer to magnetic gradients aligned towards other directions.

The gain amplifier GN may be preconfigured to operate and to amplify the signal $GS_M$ with predetermined periodicity $\tau$ and phase $\varphi$ selected in accordance with the displacement function AD and the desired direction at which enhancement of the magnetic field gradient is desired. Alternatively, or additionally the gain amplifier GN may be adapted to obtain gain input signal PH indicative of the phase $\varphi$ (and possibly also of the periodicity $\tau$) and operate to amplify the signal $GS_M$ accordingly. In the latter case, the gain input signal PH may be provided to the gain amplifier GN from the actuation controller ACT that controls/monitors/is synchronized, with the displacement function of the sensors affected by the actuation module 120.

The modulated differential magnetic field time profile $GS_M$, possibly after gain amplification, is then fed to demodulator module DM which may be implemented according to any known in the art demodulation technique (AM demodulation). In the present example, the demodulator module DM includes a local oscillator LO generating reference signal with frequency(ies) and possibly also phase(s) matching the carrier wave CW, and a mixer MIX multiplying the reference signal with the differential magnetic field time profile $GS_M$. In some cases the local oscillator LO is configured and operable to obtain from the actuation controller ACT, a signal indicative of certain properties (period and phase) of the displacement function AD, and to generate the reference signal as a carrier wave signal CW matching properties (period and phase) of the displacement function AD. Optionally, the demodulator module DM also includes one or more band pass filters FLT operable to further filter the mixed signal obtained from the mixer MIX. Thus, after the mixing, and possibly also band-pass filtering, the demodulated signal $GS_D$ is obtained indicative of at least one vector component of the magnetic field gradient $\nabla B$ while having substantially reduced noise.

FIG. 4B exemplifies digital implementation of the controller 140 which corresponds to the operation of the analogue controller 140 exemplified in FIG. 4A. Here the controller 140 includes analogue to digital converter(s) A/D adapted to obtain analogue readout information $RD_{S1}$ and possibly $RD_{S2}$ from the sensor(s) 130 and sample/convert them into digital representation, a processor PROC, such as a central processing unit (CPU) and/or digital signal processor (DSP), adapted to process the digital representation of the readouts $RD_{S1}$ (e.g. and $RD_{S2}$) to generate the demodulated signal $GS_D$, a memory MEM (e.g. volatile/non-volatile digital memory) capable of storing software (code) and/or information, such as the displacement function AD, which are needed for the processing of the readouts by the processor PROC, and optionally also digital to analogue converter D/A for converting the demodulated signal $GS_D$ into analogue form in case it is needed. Here, the processor PROC includes digital (e.g. software and/or hardware based) implementation of the differentiating module DIFF and the demodulator module DM, and possibly also the delay module DLY and the gain amplification module GN. In this case, these modules may be implemented by software and may include software code (lines/functions) implementing the functions of these modules as described above with reference to FIG. 4A and/or with reference to the relevant equations as described above. For instance, differentiating module DIFF may implement computerized processing for determining differential magnetic field time profile $GS_M$, the demodulation module DM may implement computerized processing for determining demodulated differential magnetic field time profile $GS_D$, in case of a single sensor implementation the delay module DLY may be adapted to generate a time shifted copy of the readout data $RD_{S1}$ from a certain sensor as described above for use in further processing by differentiating module DIFF, and the gain amplification module GN may implement computerized processing relating to the gain amplification with selected phase and periodicity of the displacement function, as described with reference to FIG. 4A above. Also, here the demodulation module is implemented with similar principles as those exemplified in the analogue example of FIG. 4A (namely including digital implementation of the mixer module MIX and, possibly, also digital implementation of the band pass filter FLT. Nevertheless, it should be noted that the demodulation in this case may be performed utilizing other digital signal processing techniques, for example by utilizing Fourier Analysis of the modulated differential magnetic field time profile $GS_M$, as will be appreciated by those versed in the art. Here the memory MEM may serve for storing the software code implementing the above modules and also, possibly, storing data indicative of the displacement function AD and/or the carrier wave CW and/or the operation of the actuation module 120, which actuates the sensors 130. To this end, also here actuation controller ACT operating/monitoring the operation of the actuation module 120 may be included in the system and be in communication with the memory MEM or the processor PROC, or alternatively or additionally predetermined data AD on the operation of the actuation module 120 may be pre-stored in the memory MEM.

Turning back to FIGS. 2A, 2F and 2G, as indicated above optionally in certain embodiments of the present invention, the gradiometer 100 is also configured and operable for detecting and/or locating anomalies/irregularities ANM located/buried beneath a surface of an object OBJ such as the Earth. This is achieved by scanning above at least a portion of a surface SRF of the object OBJ while operating the gradiometer 100 to measure the gradient $\nabla B$ of the magnetic field MG during the scan. In such embodiments, the gradiometer 100 may include and/or may be furnished on a platform 110, which can be driven on or above the portion of the surface SRF of the object OBJ while it is being scanned. The gradiometer 100 may include or be associated with a driving controller 112 connectable to the platform 110 and be configured and operable for obtaining path information PD (data/signals) indicative of the path along which the platform 110 is driven to scan the surface SRF of the object OBJ. The term path should be understood in this context as data/signals indicative of the position of the platform as a function of time. To this end, the driving controller 112 may be configured to actively (e.g. automatically) operate the platform to drive it along a desired path for scanning the surface SRF (e.g. for this purpose it may be connectable to driving modules engines/motors/steering of the platform 110 (not specifically illustrated in the figures)), or the platform 110 may be driven by another module and/or by personnel. The driving controller 112 is configured and operable to determine/obtain path information PD indicative of the position of the platform as a function of time. To this end, the driving controller 112 may be coupled to a driving/steering mechanism (not specifically shown) of the platform 110 and obtain the path information PD therefrom and/or the driving controller 112 may include/utilize positioning systems coupled to the platform 110 (such as inertial positioning systems and/or global positioning systems) to obtain path information PD therefrom.

Thus, during scanning of the object OBJ the controller 140 generates the demodulated differential magnetic field time profile $GS_D$ as indicated above (hereinafter referred to as gradient time profile), which is, as indicated above, indicative of the time profile of the gradient $\nabla B$ of the magnetic field MG sensed by the sensors 130, and the driving controller 112 obtains path information PD indicative of the position of the platform 110 (with the sensors 130) therefrom as a function of time.

Figure 5:
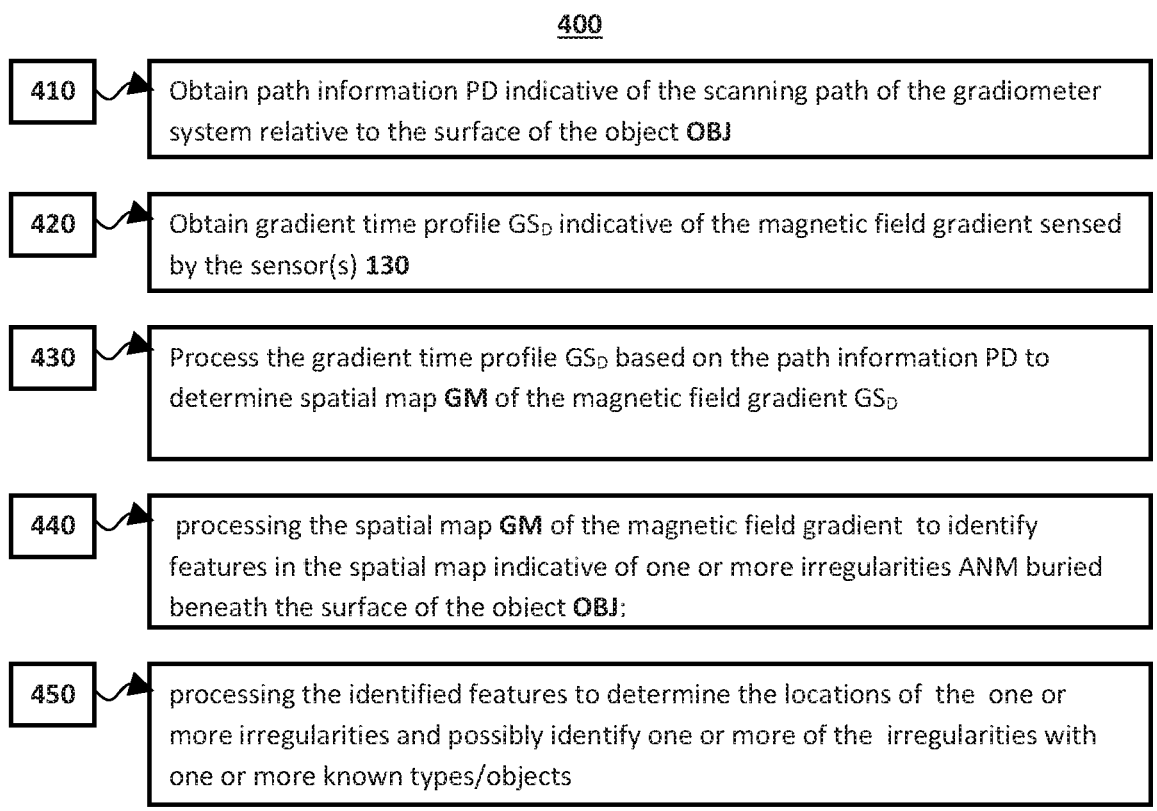
FIG. 5 exemplifies a method carried out according to certain embodiments of the present invention for mapping the magnetic field within the region of interest by scanning the region of interest with the gradiometer system of the invention.

In embodiments configured for detecting and/or locating anomalies/irregularities ANM located/buried beneath the surface of the object OBJ, the gradiometer 100 also includes a mapping module 150, which is typically implemented as a computerized system including at least a processor, a memory, and soft/hard coded computer readable instructions for detecting and locating (i.e. mapping) the magnetic irregularities ANM located/buried beneath the surface of the object. FIG. 5 is a flow chart exemplifying a method 400 carried out by the mapping module 150 according to some embodiments of the present invention to detect and/or locate and possibly also to identify anomalies/irregularities ANM located/buried in the object OBJ. In operation 410 the mapping module 150 obtains path information PD indicative of the platform's path of scanning the surface of the object OBJ. In various embodiments of the present invention the mapping module 150 actively operates the platform 110 to drive/move along the desired path PD for scanning of the object, or the platform moves independently and the mapping module 150 receives the path information PD. In operation 420 the mapping module 150 obtains the gradient time profile $GS_D$ indicative of the magnetic field gradient sensed by the sensors 130 during the scan of the object along the path PD. The gradient time profile $GS_D$ is obtained from the controller 140 which operates in accordance with method 200 described above with reference to FIG. 3A. In various embodiments of the present invention the mapping module 150 actively operates the controller 140 to generate the gradient time profile $GS_D$ during the scan of the object along the path PD, or controller 140 operates independently.

In operation 430 the mapping module 150 processes the gradient time profile $GS_D$ based on the path information PD and determines a spatial map GM of the magnetic field gradient $\nabla B$ sensed by the sensors 130 along the path PD. This is achieved by mapping the value of the gradient $\nabla B$ indicated in gradient time profile $GS_D$, to the location the platform was at this time, as indicated in the path information PD. FIG. 3B exemplifies such mapping in case of scanning the object OBJ during a relative movement between the gradiometer system 100 and the object at velocity/speed V (e.g., constant velocity) along a straight path parallel to the X direction/axis (e.g. by driving the platform 100 relative to the object). In such a case, the mapping of the gradient time profile $GS_D$ from the Time coordinate to the spatial X coordinate is linear, based on the velocity V. Accordingly, as illustrated in FIG. 3B the graphs of the gradient time profile $GS_D$ and the spatial map GM of the magnetic field gradient $\nabla B$ appear to be similar. It should be however noted that the spatial map GM may be in one, two, or three spatial dimensions in accordance with the spatial dimensionality of the scanning path PD of the platform 110.

In operation 440 the mapping module 150 processes the spatial map GM of the magnetic field gradient $\nabla B$ to identify therein features/patterns indicative of one or more irregularities ANM located/buried beneath the surface of the object OBJ. To this end it is understood that objects (e.g. anomalies/irregularities) ANM located/buried within the object_OBJ_and having magnetic permeability very much different than the nominal permeability of the object OBJ will warp/deform the lines of the magnetic field MG around them and thereby cause detectable changes in the gradient of the magnetic field which can be detected from different distances from the irregularities ANM, depending on the sensitivity of the magnetic field sensory system used. For sensor sensitivity of 0.001 nT, an anomaly ANM of several kilograms of high permeability material, the vertical distance of the anomaly ANM from the surface of the object OBJ at which the sensors are moved, could be about 30 meters.

For example FIGS. 2A, 2F, 2G and 3B show an irregularity ANM located/buried within the object OBJ. Such irregularity may be a region/element/device/material which has permeability much different to that of the object OBJ. For example, it may include Ferro-magnetic material/composition different to that of the object OBJ. The effects of irregularities having different permeability within the object OBJ would change the density of magnetic field lines passing within the irregularity ANM thereby changing the density of the magnetic field lines outside the irregularity ANM and changing the gradient of the magnetic field at certain regions outside the irregularity ANM. One has to take into account the fact that the relative permeability is near 1 for all materials except for ferromagnetic and anti-ferromagnetic materials. Accordingly, this method allows for detecting ferromagnetic/antiferromagnetic irregularities.

Accordingly, in operation 440 the mapping module 150 processes the spatial map GM of the magnetic field gradient $\nabla B$ to identify therein features/patterns indicative of irregularities ANM buried within the object OBJ. The irregularities may be different objects such as metal objects and/or voids within the scanned object OBJ. In certain embodiments the mapping module 150 is adapted to identify features/patterns corresponding to irregularities of a certain size and/or of certain magnetic features. To this end the mapping module 150 may be adapted to process the spatial map GM and search for features/patterns corresponding to the irregularities of the desired size range and/or of the desired magnetic properties and thereby detect such irregularities if they exist in the object OBJ. Such feature FTR corresponding to the irregularity ANM is encircled in FIG. 3B.

In operation 450 the mapping module 150 processes the identified features/patterns (e.g. FTR) to determine the locations of the one or more irregularities and possibly also to identify one or more of the irregularities with one or more known irregularity types (e.g., elements/devices/objects/regions/voids) within the object OBJ.

To this end, in operations 440 and 450, the shape of the identified pattern(s)/feature(s) FTR and their magnetic-reply can be used to detect, locate and possibly identify the type of the detected irregularity(ies) ANM. As will be readily appreciated by those versed in the art of magnetic field surveys, the mapping module 150 may utilize modeling information (model data or functions, such as the Anderson functions) to identify/detect pattern(s)/feature(s) FTR of interest within the spatial map GM, determine their location within the object OBJ and possibly also identify the type of irregularity from which they arise (e.g. what kind of irregularity and/or what kind of located/buried object/device/element/void caused the detected feature/pattern FTR, and its location. Such model data may be stored within a memory (not shown) of the mapping module 150.

Thus, the present invention provides a novel and inventive technique for performing magnetic field surveys. The technique utilizes a novel gradiometer system and method which are based on use of one or more magnetic sensors which are configured/arranged such that their sensing positions can be moved/displaced with repeated motion. The technique of the invention thereby overcomes the specific limitations (noise) of magnetic sensors. This is achieved inter alia by utilizing the periodic displacement/movement of the sensing positions to obtain a modulated signal of the gradient of the magnetic field, from which the gradient can be extracted with suppressed/a diminished amount of noise.

The invention claimed is:

1. A gradiometer comprising one or more magnetic sensors for sensing a magnetic field in their vicinity;
    wherein the gradiometer comprises an actuation module connectable to the one or more magnetic sensors and configured and operable to vary one or more sensing positions at which a magnetic field is sensed by said one or more sensors, such that said one or more sensing positions are varied according to a certain displacement function indicative of a displacement between the sensing positions as a function of time; and
    wherein said one or more magnetic sensors are one or more scalar atomic magnetic sensors associated with at least one vapor cell; and said actuation module is configured to vary said respective sensing positions while maintaining similar relative orientations between the one or more scalar atomic magnetic sensors and the magnetic field; wherein the gradiometer comprises a controller configured and operable for determining at least one vector component of a gradient of said magnetic field by carrying out the following:
    a. obtaining, from said one or more sensors, readout data indicative of the magnetic field sensed at said sensing positions during a certain measurement time duration at which said sensing positions are varied;
    b. processing said readout data to determine a differential magnetic field time profile indicative of a difference between magnetic fields sensed by said at least two of said sensing positions during said measurement time duration, thereby providing that said differential magnetic field time profile is indicative of at least one vector component of a gradient of said magnetic field modulated by said displacement function; and
    c. demodulating said differential magnetic field time profile in accordance with said displacement function thereby determining demodulated time profile indicative of said at least one vector component of the gradient of the magnetic field with reduced noise;
    wherein said magnetic field measurements by said scalar atomic magnetic sensors have angular dependence on a relative orientation between the magnetic field and the scalar atomic magnetic sensors, and wherein said maintaining of said similar relative orientations between the scalar atomic magnetic sensors and the magnetic field, provides for suppressing, from said differential magnetic field time profile, cumulative heading errors which are sourced by said angular dependence.

2. The gradiometer of claim 1, wherein said one or more magnetic sensors comprise a multipoint atomic sensor comprising a common vapor cell with a plurality of sensing sites coupled at different places to the common vapor cell.

3. The gradiometer of claim 2, wherein at least one sensing site of said plurality of sensing sites, includes an optically pumped magnetometer assembly including a Bell-Bloom laser setup optically coupled to the common vapor cell; said Bell-Bloom laser setup includes: a radiation port for pumping laser to excite the spins of alkali atoms in the vapor cell, and a probe for sensing a radiation response from the vapor cell being indicative of a Larmor precession of the spins of the alkali atoms that is associated with said magnetic field.

4. The gradiometer of claim 2, wherein at least one sensing site of said plurality of sensing sites includes an optically pumped magnetometer assembly optically coupled to the common vapor cell, and said optically pumped magnetometer assembly includes one or more optical deflectors arranged to deflect an optical path of a laser beam such that the laser beam traverses the common vapor cell several times from different angles before reaching a probe of said optically pumped magnetometer assembly, thereby providing reducing or entirely eliminating an angular extend of a dead zone of the magnetometer assembly.

5. The gradiometer of claim 2, wherein one or more of the sensing sites are mechanically coupled such that they are movable with respect to said common vapor cell thereby enabling to vary the sensing positions of said one or more sensing sites by moving them along the vapor cell to be optically coupled at different sensing positions, and wherein said actuation module includes a mechanical assembly coupled to said one or more sensing sites from moving them to said one or more sensing positions in accordance with said displacement function.

6. The gradiometer of claim 2, wherein one or more of the sensing sites include two or more fixedly coupled sensing sites that are coupled to said common vapor cell at fixed sensing positions, and wherein said actuation module includes an electronic inter-switching mechanism configured and operable to acquire magnetic measurements from the fixedly coupled sensing sites while selectively switching between the magnetic measurements from the fixedly coupled sensing sites which are used at each moment to compute said differential magnetic field time profile, whereby said switching is performed in order to virtually move the sensing positions from which the magnetic measurements that are used at each moment to compute said differential magnetic field time profile are obtained in accordance with said displacement function and with the fixed sensing positions of said sensing sites, to thereby vary the sensing positions based on which said differential magnetic field time profile is computed in accordance with said displacement function.

7. The gradiometer of claim 6, wherein at least one of the following:
said fixedly coupled sensing sites are continuously operated to measure the magnetic field at their respective fixed sensing positions and wherein said inter-switching mechanism is configured and operable for varying said sensing positions based on which said differential magnetic field time profile is computed by switching between samples of the magnetic field measurements obtained from the fixedly coupled sensing sites in accordance with said displacement function;
said inter-switching mechanism is configured and operable for selectively operating said fixedly coupled sensing sites for sensing the magnetic field such that the sensing positions, based on which said differential magnetic field time profile is computed, is varied accordance with said displacement function.

8. The gradiometer of claim 1, wherein the actuation module is mechanically connected to one or more of the magnetic sensors and configured and operable to vary their respective one or more sensing positions by actuating movement of said one or more magnetic sensors to move their respective positions according to said displacement function; and wherein said one or more magnetic sensors are preferably connected to said actuation module via respective pivotal mechanisms which are adapted to permit said maintaining of the orientation of the magnetic sensors.

9. The gradiometer of claim 8, wherein said actuation module comprises a conveyor system adapted for actuating said one or more magnetic sensors along at least one motion path; said one or more magnetic sensors are mounted to said conveyor system by said pivotal mechanisms respectively, such that said pivotal mechanisms are substantially perpendicular to said certain motion path of the conveyor system thereby enabling to maintain the orientation of said one or more sensors during operation of said conveyor system.

10. The gradiometer of claim 1, wherein said one or more scalar atomic magnetic sensors are associated with active sensing angular zones from which accurate magnetic field measurements can be obtained and with dead sensing angular zones at which at least one of the sensitivities or accuracies of said one or more magnetic sensors are reduced, and wherein said actuation module is configured to vary the respective positions of the one or more magnetic sensors while maintaining the orientation of the sensors such that a direction of the magnetic field to be sensed thereby is within the active sensing angular zones of sensors.

11. The gradiometer of claim 1, wherein said actuation module is configured and operable to vary said respective sensing positions along a certain motion path, and allow tuning of said certain motion path to enable selection of the vector component of the gradient of the magnetic field that is measured by the gradiometer.

12. The gradiometer of claim 1, wherein said one or more magnetic sensors include at least one magnetic sensor that is mechanically coupled for movement by said actuation module; and
wherein said processing of the one or more time profiles comprises subtracting a first time profile of the readout data from said sensor from a second time profile, being a time shifted copy of said first time profile, shifted by a certain shift duration to thereby determine said differential magnetic field time profile as a difference of the magnetic field sensed by said at least one magnetic sensor at different locations, and said demodulating comprises determining displacement data between the location of the sensor associated with said first time profile and the location of the sensor associated with said second time profile by subtracting said displacement function from a time shifted copy thereof that is being time shifted by said shift duration.

13. The gradiometer of claim 1, wherein said one or more magnetic sensors include at least two magnetic sensors that are mechanically coupled for movement by said actuation module; and
wherein said processing of the one or more time profiles comprises subtracting a time profile of readout data read from first one of said sensor from a time profile of readout data read from a second one of said sensor to thereby determine said differential magnetic field time profile as a difference of the magnetic field simultaneously sensed by said at least two sensors at different locations; and
wherein said demodulating comprises utilizing said displacement function to determine displacement data indicative of the displacement between said at least two sensor(s) as a function of time and demodulating said differential magnetic field time profile based on said displacement data.

14. The gradiometer of claim 1, wherein said one or more magnetic sensors include at least one multipoint magnetic sensor including one or more sensing sites optically coupled to a common vapor cell; and
  wherein said actuation module is adapted for varying at least two sensing position(s) from which magnetic field measurements are obtained from said common vapor cell by at least one of: (i) mechanically moving the one or more sensing sites with respect to said common vapor cell, and (ii) selectively electronically switching between a plurality of said sensing sites located at different sensing positions from which the magnetic measurements are used for determining said differential magnetic field time profile at each moment;
  whereby the respective one of the mechanical movement and electronic switching, is performed in accordance with said displacement function between the sensing positions, to thereby obtain at least two time profiles respectively indicative of the magnetic field that is measured at said least two sensing positions with the displacement between them varied in accordance with said displacement function; and
  wherein said processing of the at least two time profiles comprises subtracting one of the time profiles from another one of the time profiles to thereby determine said differential magnetic field time profile as a difference of the magnetic field sensed simultaneously at the at least two sensing positions whose displacement between them is varied, utilizing said displacement function to determine said displacement function as displacement data indicative of the displacement between said at least two sensing positions as a function of time and demodulating said differential magnetic field time profile based on said displacement data.

15. The gradiometer of claim 1, comprising a movable platform carrying said one or more magnetic sensors; said gradiometer is configured and operable for detecting and locating magnetic irregularities within an object, by moving said movable platform over at least a portion of a surface of the object while operating said one or more sensors and said actuator module to apply passive gradiometer scanning to at least said portion of the surface, obtain mapping information indicative of said gradient of the magnetic field sensed during said gradiometer scanning and processing said mapping information to identify magnetic field patterns indicative of said irregularities; and
  wherein preferably said actuation module and said platform comprise substantially non-magnetic materials.

16. A method of measuring magnetic field gradients comprising:
  operating one or more magnetic sensors for sensing a magnetic field during a certain measurement time duration, while varying the sensing position(s) of said one or more sensors according to a certain displacement function indicative of a displacement between the sensing positions as a function of time; and
  determining at least one vector component of a gradient of said magnetic field;
  wherein said one or more magnetic sensors are scalar atomic magnetic sensors associated with active sensing angular zones and with dead sensing angular zones; and wherein the said varying of the sensing positions of the one or more sensors, is performed while maintaining the orientation of the one or more sensors such that a direction of the magnetic field to be sensed thereby is within the active sensing angular zones of the one or more sensors; and
  said determining of the at least one vector component of the gradient of said magnetic field comprises by carrying out the following:
  a. obtaining, from said one or more sensors, readout data indicative of the magnetic field sensed at said sensing positions during a certain measurement time duration at which said sensing positions are varied according to said displacement function;
  b. processing said readout data to determine a differential magnetic field time profile indicative of a difference between magnetic fields sensed in at least two of said sensing positions during said measurement time duration, thereby providing that said differential magnetic field time profile is indicative of at least one vector component of a gradient of said magnetic field modulated by said displacement function; and
  c. demodulating said differential magnetic field time profile in accordance with said displacement function thereby determining demodulated time profile indicative of said at least one vector component of the gradient of the magnetic field with reduced noise.

17. The method of claim 16, wherein said one or more magnetic sensors include at least one multipoint magnetic sensor including a plurality of sensing sites optically coupled to a common vapor cell;
  wherein varying said sensing positions comprises varying at least two sensing positions on said common vapor cell, from which the magnetic field measurements are used for determining said differential magnetic field time profile, whereby said varying comprises at least one of: (i) mechanically moving the sensing sites with respect to said common vapor cell so as to move said sensing positions, and (ii) selectively electronically switching between the sensing sites from which the magnetic measurements are used for determining said differential magnetic field time profile at each moment;
  whereby the respective one of the mechanical movement and/or electronic switching, is performed in accordance with said displacement function between the sensing position(s), to thereby obtain at least two time profiles respectively indicative of the magnetic field that is measured at said least two sensing positions, whose relative displacement is varied in accordance with said displacement function; and
  wherein said processing of the at least two time profiles comprises subtracting one of the time profiles from another one of the time profiles to thereby determine said differential magnetic field time profile; and
  said demodulating comprises utilizing said displacement function to determine displacement data indicative of the displacement between said at least two sensing positions, as a function of time and demodulating said differential magnetic field time profile based on said displacement data.

18. The method of claim 16, wherein said one or more magnetic sensors include at least two magnetic sensors that are mechanically coupled for movement;
  wherein said varying of the sensing positions includes moving said at least two sensors to vary a displacement between them in accordance with said displacement function; said maintaining the orientation of the sensors comprises operating one or more pivotal mechanisms connectable to said one or more sensors respectively; and
  wherein said processing of the one or more time profiles comprises subtracting a time profile of readout data read from first one of said sensor from a time profile of readout data read from a second one of said sensor to thereby determine said differential magnetic field time profile as a difference of the magnetic field simultaneously sensed by said at least two sensors at different locations; and wherein said demodulating comprises utilizing said displacement function to determine displacement data indicative of the displacement between said at least two sensors as a function of time and demodulating said differential magnetic field time profile based on said displacement data.

19. The method of claim 16, wherein said one or more magnetic sensors include at least one magnetic sensor that is mechanically coupled for movement;

wherein said varying of the sensing positions includes moving said sensor in accordance with said displacement function; said maintaining the orientation of the sensors comprises operating one or more pivotal mechanisms connectable to said one or more sensors respectively;

said processing of the one or more time profiles comprises subtracting a first time profile of the readout data from said sensor from a second time profile, being a time shifted copy of said first time profile, shifted by a certain shift duration to thereby determine said differential magnetic field time profile as a difference of the magnetic field sensed by said at least one magnetic sensor at different locations with the displacement between them varied in accordance with said displacement function; and wherein said demodulating comprises providing displacement data indicative of said displacement function whereby said displacement data corresponds to the displacement between the location of the sensor during said first time profile and the location of the sensor during said second time profile, and demodulating said differential magnetic field time profile based on said displacement data.

20. The method of claim 16, wherein said displacement function is indicative of a displacement vector between said sensing positions as a function of time, and wherein one or more of the following:

a. said actuating comprises changing said respective sensing positions of the one or more sensors to vary a magnitude of said displacement vector while maintaining a direction of said displacement vector aligned along a certain axis along which measurement of the magnetic field gradient is desired;

b. said actuating comprises rotating said displacement vector about at least one rotation axis.

* * * * *